(12) United States Patent
Hill

(10) Patent No.: US 7,324,216 B2
(45) Date of Patent: Jan. 29, 2008

(54) SUB-NANOMETER OVERLAY, CRITICAL DIMENSION, AND LITHOGRAPHY TOOL PROJECTION OPTIC METROLOGY SYSTEMS BASED ON MEASUREMENT OF EXPOSURE INDUCED CHANGES IN PHOTORESIST ON WAFERS

(75) Inventor: Henry Allen Hill, Tucson, AZ (US)

(73) Assignee: Zetetic Institute, Tucson, AZ (US)

( * ) Notice: Subject to any disclaimer, the term of this patent is extended or adjusted under 35 U.S.C. 154(b) by 0 days.

(21) Appl. No.: 11/208,424

(22) Filed: Aug. 19, 2005

(65) Prior Publication Data

US 2006/0050283 A1 Mar. 9, 2006

Related U.S. Application Data

(60) Provisional application No. 60/624,707, filed on Nov. 3, 2004, provisional application No. 60/618,483, filed on Oct. 13, 2004, provisional application No. 60/602,999, filed on Aug. 19, 2004.

(51) Int. Cl.
*G01B 11/02* (2006.01)
*G03B 27/42* (2006.01)

(52) U.S. Cl. .......................... 356/512; 355/53
(58) Field of Classification Search ............... 356/489, 356/495, 511, 512; 355/27, 53, 72; 396/611
See application file for complete search history.

(56) References Cited

U.S. PATENT DOCUMENTS

| | | |
|---|---|---|
| 3,628,027 A | 12/1971 | Brauss |
| 3,748,015 A | 7/1973 | Offner |
| 4,011,011 A | 3/1977 | Hemstreet et al. |
| 4,226,501 A | 10/1980 | Shafer |
| 4,272,684 A | 6/1981 | Seachman |
| 4,408,884 A | 10/1983 | Kleinknecht et al. |
| 4,672,196 A | 6/1987 | Canino |
| 4,685,803 A | 8/1987 | Sommargren |
| 4,733,967 A | 3/1988 | Sommargren |
| 5,220,403 A | 6/1993 | Batchelder et al. |
| 5,241,423 A | 8/1993 | Chiu et al. |
| 5,327,223 A | 7/1994 | Korth |
| 5,384,639 A | 1/1995 | Wickramasinghe |
| 5,392,118 A | 2/1995 | Wickramasinghe |
| 5,485,317 A | 1/1996 | Perissinotto |
| 5,602,643 A | 2/1997 | Barrett |
| 5,614,763 A | 3/1997 | Womack |

(Continued)

OTHER PUBLICATIONS

U.S. Appl. No. 60/442,858, filed Jan. 27, 2003, Hill.

(Continued)

*Primary Examiner*—Patrick Connolly
(74) *Attorney, Agent, or Firm*—Wilmer Cutler Pickering Hale & Dorr LLP

(57) ABSTRACT

A method of processing a substrate on which a layer of photoresist has been applied, the method involving: exposing the layer of photoresist to radiation that carries spatial information to generate exposure-induced changes in the layer of photoresist that form a pattern having one or more features; and before developing the exposed photoresist, interferometrically obtaining measurements of the pattern in the exposed layer of photoresist for determining at least one of (1) locations of the one or more features of the pattern and (2) magnitudes of the exposure-induced changes.

33 Claims, 15 Drawing Sheets

U.S. PATENT DOCUMENTS

| | | | |
|---|---|---|---|
| 5,633,972 | A | 5/1997 | Walt |
| 5,659,420 | A | 8/1997 | Wakai |
| 5,699,201 | A | 12/1997 | Lee |
| 5,757,493 | A | 5/1998 | Vaknerkhove |
| 5,760,901 | A | 6/1998 | Hill |
| 5,828,455 | A | 10/1998 | Smith |
| 5,894,195 | A | 4/1999 | McDermott |
| 5,915,048 | A | 6/1999 | Hill et al. |
| 5,923,423 | A | 7/1999 | Sawatari et al. |
| 6,011,654 | A | 1/2000 | Schweizer et al. |
| 6,018,391 | A | 1/2000 | Yosida |
| 6,052,231 | A | 4/2000 | Rosenbluth |
| 6,091,496 | A | 7/2000 | Hill |
| 6,124,931 | A | 9/2000 | Hill |
| 6,271,923 | B1 | 8/2001 | Hill |
| 6,330,065 | B1 | 12/2001 | Hill |
| 6,445,453 | B1 | 9/2002 | Hill |
| 6,447,122 | B1 | 9/2002 | Kobayashi et al. |
| 6,469,788 | B2 | 10/2002 | Boyd et al. |
| 6,480,285 | B1 | 11/2002 | Hill |
| 6,552,805 | B2 | 4/2003 | Hill |
| 6,552,852 | B2 | 4/2003 | Hill |
| 6,597,721 | B1 | 7/2003 | Hutchinson et al. |
| 6,606,159 | B1 | 8/2003 | Hill |
| 6,667,809 | B2 | 12/2003 | Hill |
| 6,707,561 | B1 | 3/2004 | Budach et al. |
| 6,714,349 | B2 | 3/2004 | Nam |
| 6,717,736 | B1 | 4/2004 | Hill |
| 6,753,968 | B2 | 6/2004 | Hill |
| 6,771,374 | B1 | 8/2004 | Rangarajan et al. |
| 6,775,009 | B2 | 8/2004 | Hill |
| 6,806,959 | B2 | 10/2004 | Tukker |
| 6,847,029 | B2 | 1/2005 | Hill |
| 6,847,452 | B2 | 1/2005 | Hill |
| 2002/0074493 | A1 | 6/2002 | Hill |
| 2002/0131179 | A1 | 9/2002 | Hill |
| 2003/0174992 | A1 | 9/2003 | Levene |
| 2004/0201852 | A1 | 10/2004 | Hill |
| 2004/0201853 | A1 | 10/2004 | Hill |
| 2004/0201854 | A1 | 10/2004 | Hill |
| 2004/0201855 | A1 | 10/2004 | Hill |
| 2004/0202426 | A1 | 10/2004 | Hill |
| 2004/0227950 | A1 | 11/2004 | Hill |
| 2004/0227951 | A1 | 11/2004 | Hill |
| 2004/0228008 | A1 | 11/2004 | Hill |
| 2004/0246486 | A1 | 12/2004 | Hill |
| 2004/0257577 | A1 | 12/2004 | Hill |
| 2005/0036149 | A1 | 2/2005 | Hill |
| 2005/0037272 | A1* | 2/2005 | Tanaka ................. 355/27 |
| 2005/0111006 | A1 | 5/2005 | Hill |
| 2005/0111007 | A1 | 5/2005 | Hill |

OTHER PUBLICATIONS

U.S. Appl. No. 60/443,980, filed Jan. 31, 2003, Hill.
U.S. Appl. No. 60/444,707, filed Feb. 4, 2003, Hill.
U.S. Appl. No. 60/447,254, filed Feb. 13, 2003, Hill.
U.S. Appl. No. 60/448,360, filed Feb. 19, 2003, Hill.
U.S. Appl. No. 60/459,493, filed Apr. 1, 2003, Hill.
U.S. Appl. No. 60/485,255, filed Jul. 7, 2003, Hill.
U.S. Appl. No. 60/501,666, filed Sep. 10, 2003, Hill.
U.S. Appl. No. 60/507,675, filed Oct. 1, 2003, Hill.
U.S. Appl. No. 60/569,807, filed May 11, 2004, Hill.
U.S. Appl. No. 60/573,196, filed May 21, 2004, Hill.
U.S. Appl. No. 60/571,967, filed May 18, 2004, Hill.
U.S. Appl. No. 60/568,774, filed May 6, 2004, Hill.
U.S. Appl. No. 60/506,715, filed Sep. 26, 2003, Hill.
U.S. Appl. No. 60/485,507, filed Jul. 7, 2003, Hill.
U.S. Appl. No. 60/460,129, filed Apr. 3, 2003, Hill.
U.S. Appl. No. 60/459,425, filed Apr. 11, 2003, Hill.
U.S. Appl. No. 60/448,250, filed Feb. 19, 2003, Hill.
U.S. Appl. No. 60/445,739, filed Feb. 7, 2003, Hill.
U.S. Appl. No. 60/442,982, filed Jan. 29, 2003, Hill.

* cited by examiner

SUB-NANOMETER OVERLAY, CRITICAL DIMENSION, AND LITHOGRAPHY TOOL PROJECTION OPTIC METROLOGY SYSTEMS BASED ON MEASUREMENT OF EXPOSURE INDUCED CHANGES IN PHOTORESIST ON WAFERS

This application claims the benefit of U.S. Provisional Application No. 60/602,999, filed Aug. 19, 2004; U.S. Provisional Application No. 60/618,483, filed Oct. 13, 2004; and U.S. Provisional Application No. 60/624,707, filed Nov. 3, 2004.

RELATED APPLICATIONS

The following applications are related to the present application: U.S. Ser. No. 60/447,254, filed Feb. 13, 2003, and U.S. Ser. No. 10/778,371, filed Feb. 13, 2004, both of which are entitled "Transverse Differential Interferometric Confocal Microscopy," (ZI-40); U.S. Ser. No. 60/448,360, filed Feb. 19, 2003, and U.S. Ser. No. 10/782,057, filed Feb. 19, 2004, both of which are entitled "Longitudinal Differential Interferometric Confocal Microscopy For Surface Profiling," (ZI-41); U.S. Ser. No. 60/448,250, filed Feb. 19, 2003, and U.S. Ser. No. 10/782,058, filed Feb. 19, 2004, both of which are entitled "Method And Apparatus For Dark Field Interferometric Confocal Microscopy," (ZI-42); U.S. Ser. No. 60/443,980, filed Jan. 31, 2003 and U.S. Ser. No. 10/765,254, filed Jan. 27, 2004, entitled "Utility Leaky Guided Wave Modes Used in Interferometric Confocal Microscopy to Measure Properties of Trenches," (ZI-46); U.S. Ser. No. 60/459,425, filed Apr. 1, 2003, entitled "Apparatus And Method For Joint Measurement Of Fields Of Scattered/Reflected Orthogonally Polarized Beams By An Object In Interferometry," and U.S. Ser. No. 10/816,180, filed Apr. 1, 2004, entitled "Apparatus And Method For Joint Measurement Of Fields Of Scattered/Reflected Or Transmitted Orthogonally Polarized Beams By An Object In Interferometry," (ZI-50); U.S. Ser. No. 60/485,507, filed Jul. 7, 2003, and U.S. Ser. No. 10/886,010, filed Jul. 7, 2004, both of which are entitled "Apparatus And Method For High Speed Scan For Sub-Wavelength Defects And Artifacts In Semiconductor Metrology," (ZI-52); U.S. Ser. No. 60/485,255, filed Jul. 7, 2003, entitled "Apparatus and Method for Ellipsometric Measurements With High Spatial Resolution," (ZI-53); U.S. Ser. No. 60/507,675, filed Oct. 1, 2003, entitled "Method and Apparatus for Enhanced Resolution of High Spatial Frequency Components of Images Using Standing Wave Beams in Non-Interferometric and Interferometric Microscopy," (ZI-55); U.S. Ser. No. 60/602,046, filed Aug. 16, 2004, and U.S. Ser. No. (T.B.D.), filed Aug. 16, 2005, both of which are entitled "Apparatus and Method for Joint and Time Delayed Measurements of Components of Conjugated Quadratures of Fields of Reflected/Scattered Beams by an Object in Interferometry," (ZI-57); U.S. Ser. No. 60/568,774, filed May 6, 2004, entitled "Apparatus and Methods for Measurement of Critical Dimensions of Features and Detection of Defects in UV, VUV, and EUV Lithography Masks," (ZI-60); U.S. Ser. No. 60/569,807, filed May 11, 2004, entitled "Apparatus and Methods for Measurement of Critical Dimensions of Features and Detection of Defects in UV, VUV, and EUV Lithography Masks," (ZI-61); U.S. Ser. No. 60/573,196, filed May 21, 2004, and U.S. Ser. No. 11/135,605, filed May 23, 2005, both of which are entitled "Apparatus and Methods for Overlay, Alignment Mark, and Critical Dimension Metrologies Based on Optical Interferometry," (ZI-62); U.S. Ser. No. 60/571,967, filed May 18, 2004, entitled "Apparatus And Methods For Measurement Of Critical Dimensions Of Features And Detection Of Defects In UV, VUV, and EUV Lithography Masks," (ZI-63); U.S. Ser. No. 60/602,999, filed Aug. 19, 2004, entitled "Sub-Nanometer Overlay, Critical Dimension, and Lithography Tool Projection Optic Metrology Systems Based on Measurement of Exposure Induced Changes in Photoresist on Wafers," (ZI-64); and U.S. Ser. No. 60/618,483, filed Oct. 13, 2004, entitled "Sub-Nanometer Overlay, Critical Dimension, and Lithography Tool Projection Optic Metrology Systems Based on Measurement of Exposure Induced Changes in Photoresist on Wafers," (ZI-65), all of which are incorporated herein by reference.

TECHNICAL FIELD

This invention is generally in the field of manufacturing of multi-layer structures, such as semiconductor wafers and integrated circuits (ICs), and relates to measuring overlay alignment accuracy, CDs of pattern features, the location of the PO optic axis, and monitoring the PO aberrations through the use of displacement and imaging interferometric metrology systems operating in the IR to VUV and EUV and the use of measured properties of reflected/scattered or transmitted fields in the IR to VUV and EUV by patterns, i.e., two- or three-dimensional patterns, in photoresist generated by exposure induced changes of refractive index, density, and/or thickness of the photoresist with or without post exposure treatment. The results of the metrology systems may be augmented with results of inversion analyses based on rigorous treatment of electromagnetic fields reflected/scattered or transmitted by patterns in exposure induced changes in the photoresist and by patterns in patterned wafer substrates.

BACKGROUND OF THE INVENTION

Aerial imaging overlay technology has been a reassuringly familiar feature of semiconductor manufacturing for years, experiencing little change. The wafers are loaded, special box-in-box (BiB) structures or targets are examined using a white-light microscope, and the images are then processed to determine overlay error. Although this has worked well, there are several issues as the industry moves toward implementing deep nanometer process levels with for example image overlay tools, measurement of CDs, determination of the location of the PO optic axis, and monitoring the PO aberrations.

With respect to overlay metrology, one of these issues has to do with the traditionally used BiB structures which tend to have large geometries and typically consist of bars microns in size that do not correspond to circuit feature sizes. Additionally, the BiB structures tend to have large areas of low feature density which polish at different rates than circuit areas with high feature density. As increasingly smaller features are being produced, it has become apparent that the behavior of these traditional BiB targets does not accurately reflect that of the circuit features themselves.

This imaging overlay uncertainty has been tolerable because process windows have not had to be too tight and the available precision and accuracy have been adequate. Now, smaller geometries are resulting in accuracy issues that must be addressed in imaging overlay tools, in particular the tool-induced shift (TIS). For imaging overlay tools, TIS can be on the order of several nanometers. At the 65 nm node, 2 or 3 nm of TIS is a significant measurement uncertainty.

Imaging overlay makes it difficult to reduce TIS because it is critically dependent upon residual aberrations in the imaging overlay optics with the most critical one being the microscope objective. Strehl ratios as high as 0.9 often do not provide the TIS performance required for advanced design rules. Thus, the technology faces not only optical problems but the fact that traditional overlay marks do not represent the actual behavior of circuit features that are orders of magnitude smaller.

Overlay metrology is the art of checking the quality of alignment after lithography. Overlay error is defined as the offset between two patterned layers from their ideal relative position. An overlay error is a vector quantity with two components in the plane of the wafer. Depending on the context, overlay error may signify one of the components or the magnitude of the vector.

Overlay metrology saves subsequent process steps that would be built on a faulty foundation in case of an alignment error. Overlay metrology provides the information that is necessary to correct the alignment of the stepper-scanner and thereby minimize overlay error on subsequent wafers. Moreover, overlay errors detected on a given wafer after exposing and developing the photoresist can be corrected by removing the photoresist and repeating the lithography step on a corrected stepper-scanner. If the measured error is minor, parameters for subsequent steps of the lithography process could be adjusted based on the output of the overlay metrology to avoid excursions. If overlay error is measured subsequently, e.g., after the etch step that typically follows the develop step, it can be used to "scrap" severely misprocessed wafers, or to adjust process equipment for better performance on subsequent wafers, i.e., APC.

As the CD in IC device reduces, the total overlay budget needs to be more stringent. Typically, the allowable overlay error is ⅓ of the CD in the IC device. In this case, robustness of alignment mark is critical as accurate signal is required by the scanner's alignment system to precisely align a pattern of a layer to the pattern of the previous layer. Alignment issue is more severe in a back-end process partly due to the influence of CMP, which contributes to the asymmetric deformation or total destruction of the alignment marks. The corresponding error in overlay accuracy has been called wafer induced shift (WIS).

Alignment marks and patterns used in overlay metrology can be placed on/in the scribe-line between die sites on a wafer in order not to waste the usable area on the wafer. Dimensions of a standard scribe-line are 80 microns. Preferably, the alignment marks and the patterns should be as small as possible so as to create the option of reducing the size of scribe-lines and subsequently lead to an increase in the usable area on the wafer.

However, reduced physical size of alignment marks and of overlay patterns used in overlay metrology reduces the magnitude of the diffracted signals detected in determination of alignment marks and overlay errors, respectively. Thus it is desirable to have an alignment mark metrology system and an overlay metrology system that meet the overlay accuracy requirements, have reduced TIS, can compensate for WIS, and reduces the area required for the alignment marks and the overlay patterns.

The problems that arise in an optical measurement of a CD can also include those introduced by TIS and WIS. Thus an overlay metrology system and an alignment mark metrology system that successfully address the affects of TIS and WIS for a given technology node can be adapted for use in an improved CD metrology system.

Defects of different types can affect the performance of overlay and CD metrology systems. Accordingly, it is desirable for the respective metrology systems to be able to detect the presence of defects of the different types and take appropriate measures when the presence of a defect is detected.

Prior overlay metrology methods use built-in test patterns etched or otherwise formed into or on the various layers during the same set of lithography steps that form the patterns for circuit elements on the wafer. The typical BiB pattern consists of two concentric squares, formed on a lower and an upper layer, respectively. "Bar-in-bar" is a similar pattern with just the edges of the "boxes" demarcated and broken into disjoint line segments. Typically one is the upper pattern and the other is the lower pattern, i.e., corresponding to earlier and later steps in the process. There are other patterns used for overlay metrology. The squares or bars are formed by lithographic and other processes used to make planar structures, e.g., CMP. Currently, the patterns for the boxes or bars are stored on lithography masks and projected onto the wafer. Other methods for putting the patterns on the wafer are possible, e.g., direct electron beam writing from computer memory, etc.

In one form of the prior art, a high performance microscope imaging system combined with image processing software estimates overlay error for the two layers. The image processing software uses the intensity of light at a multitude of pixels. Obtaining the overlay error accurately requires a high quality imaging system and means of focusing it. Some of this prior art is reviewed by the article "Semiconductor Pattern Overlay", by Neal T. Sullivan, *Handbook of Critical Dimension Metrology and Process Control*, Kevin M. Monahan, ed., SPIE Optical Engineering Press, CR52, p. 160. A. Starikov, D. J. Coleman, P. J. Larson, A. D. Lapata, and W. A. Muth in "Accuracy of Overlay Measurements: Tool and Mark Asymmetry Effects," *Optical Engineering,* 31, 1992, p. 1298, teach measuring overlay at one wafer orientation, rotating the wafer by 180°, measuring overlay again and attributing the difference to tool errors and overlay mark asymmetry.

One requirement for the imaging system of a lithography tool is very stable positioning of the PO optic axis with respect to a sample or wafer and PO aberration control. Relative vibration would blur the image and degrade the performance. This is a difficult requirement to meet for overlay metrology systems that are integrated into a process tool. The tool causes potentially large accelerations (vibrations), e.g., due to high acceleration wafer handlers. The tight space requirements for integration preclude bulky isolation strategies.

In addition to the requirement for the very stable positioning of the PO optic axis relative to the sample or wafer, there is a requirement for very stable imaging properties of the PO, i.e., the PO aberrations must be stable. Both of these two requirements are progressively becoming more difficult to meet in lithography tools and in particular progressively more difficult to meet during the exposure cycle of a wafer as the sizes of technology nodes and concomitantly the exposure wavelength of the lithography tools decrease to meet the continuing demand for higher performance of semiconductor products.

The imaging based overlay measurement precision can be two orders of magnitude smaller than the wavelength of the light used to image the target patterns of concentric boxes or bars. At such small length scales, the image does not have well determined edges because of diffraction. The determination of the edge, and therefore the overlay measurement, is affected by any factor that changes the diffraction pattern. CMP is a commonly used technique to planarize the wafer surface at intermediate process steps before depositing more material. CMP can render the profile of the trenches or lines that make up the overlay measurement targets asymetric. The asymmetry in target changes the diffraction pattern, thus potentially causing an overlay measurement error.

In U.S. Pat. No. 4,757,207, Chappelow, et al. teach obtaining the quantitative value of the overlay offset from the reflectance of targets that consists of identical line gratings that are overlaid upon each other on a planar substrate. Chappelow et al. approximate the reflectance of the overlapping gratings as the average of the reflectances of four film stacks weighted by their area-fractions. This approximation, which neglects diffraction, has some validity when the lines and spaces are larger than largest wavelength of the reflectometer. The reflectance of each of the four film stacks is measured at a so called macro-site close to the overlay target. Each macro-site has a uniform film stack over a region that is larger than the measurement spot of the reflectometer. A limitation of U.S. Pat. No. 4,757,207 is that spatial variations in the film thickness that are caused by CMP and resist loss during lithography will cause erroneous overlay measurements.

Another limitation of U.S. Pat. No. 4,757,207 is that reflectance is measured at eight sites in one overlay metrology target, which increases the size of the target and decreases the throughput of the measurement. Another limitation of U.S. Pat. No. 4,757,207 is that the lines and spaces need to be large compared to the wavelength, but small compared to the measurement spot which limits the accuracy and precision of the measurement.

Another limitation of U.S. Pat. No. 4,757,207 is that the light intensity is measured by a single photodiode. The dependence of the optical properties of the sample is not measured as a function of wavelength, or angle of incidence, or polarization, which limits the precision of the measurement.

The "average reflectivity" approximation for the interaction of light with gratings, as employed by U.S. Pat. No. 4,757,207, greatly simplifies the problem of light interaction with a grating but neglects much of the diffraction physics. The model used to interpret the data has four distinct regions whose respective reflectivities are determined by the combination of layers formed by the substrate and the overlaid patterns and by the respective materials in the substrate and patterns. Equation (1) in the U.S. Pat. No. 4,757,207 clearly indicates that these regions do not interact, i.e., via diffraction, as the total reflectivity of the structure is a simple average of the four reflectivities with area weighting.

IBM Technical Disclosure Bulletin 90A 60854/GE8880210, Mar. 1990, p 170, teaches measuring offset between two patterned layers by overlapping gratings. There are four sets of overlapping gratings to measure the x-offset and another four sets of overlapping gratings to measure the y-offset. The four sets of gratings, which are measured by a spectroscopic reflectometer, have offset biases of 0, ¼, ½, ¾-pitch. GE880210 does not use a model that accounts for the diffraction of light by the gratings or the multiple scattering of the light by the two gratings, and it has no provision to handle non-rectangular line profiles.

In U.S. Pat. No. 6,150,231, Muller et al. teach measuring overlay by Moire patterns. The Moire pattern is formed by overlapping gratings patterns, one grating on the lower level, another on the upper level. The two grating patterns have different pitches. The Moire pattern approach requires imaging the overlapping gratings and estimating their offset from the spatial characteristics of the image.

In U.S. Pat. Nos. 6,023,338 and 6,079,256, Bareket teaches an alternative approach in which two complementary periodic grating structures are produced on the two subsequent layers that require alignment. The two periodic structures are arranged adjacent to and in fixed positions relative to one another, such that there is no overlap of the two structures. The two gratings are scanned, either optically or with a stylus, so as to detect the individual undulations of the gratings as a function of position. The overlay error is obtained from the spatial phase shift between the undulations of the two gratings.

Smith et al. in U.S. Pat. No. 4,200,395 and Ono in U.S. Pat. No. 4,332,473 teach aligning a wafer and a mask by using overlapping diffraction gratings and measuring higher order, i.e., non-specular, diffracted light. One diffraction grating is on the wafer and another one is on the mask. The overlapping gratings are illuminated by a normally incident light and the intensities of the positive and negative diffracted orders, e.g. 1st and −1st orders, are compared. The difference between the intensities of the 1st and −1st diffracted orders provides a feedback signal which can be used to align the wafer and the mask. These inventions are similar to the International (PCT) application publication no. WO 02/065545 A2 in that they use overlapping gratings on two layers. However, the U.S. Pat. Nos. 4,200,395 and 4,332,473 patents are applicable to mask alignment but not to overlay metrology. They do not teach how to obtain the quantitative value of the offset from the light intensity measurements. U.S. Pat. Nos. 4,200,395 and 4,332,473 are not applicable to a measurement system that only uses specular, i.e., zeroth-order diffracted light.

WO 02/065545 A2 teaches measuring overlay by scatterometry. Measurements of structural parameters of a diffracting structure from optical characterization are now well known in the art as scatterometry. With such methods, a measurement sample is illuminated with optical radiation, and the sample properties are determined by measuring characteristics of the scattered radiation (e.g., intensity, polarization state, or angular distribution). A diffracting structure consists of one or more layers that may have lateral structure within the illuminated and detected area, resulting in diffraction of the reflected (or transmitted) radiation. If the lateral structure dimensions are smaller than the illuminating wavelengths, then diffracted orders other than the zeroth order may all be evanescent and not directly observable. But the structure geometry can nevertheless significantly affect the zeroth-order reflection, making it possible to make optical measurements of structural features much smaller than the illuminating wavelengths.

In one type of measurement process of WO 02/065545 A2, a microstructure is illuminated and the intensity of reflected or diffracted radiation is detected as a function of the radiation's wavelength, the incidence direction, the collection direction, or polarization state (or a combination of such factors). Direction is typically specified as a polar angle and azimuth, where the reference for the polar angle is the normal to the wafer and the reference for the azimuth is either some pattern(s) on the wafer or other marker, e.g., a notch or a flat for silicon wafers. The measured intensity data is then passed to a data processing machine that uses some model of the scattering from possible structures on the wafer. For example, the model may employ Maxwell's equations to calculate the theoretical optical characteristics as a function of measurement parameters (e.g., film thickness, line width, etc.), and the parameters are adjusted until the measured and theoretical intensities agree within specified convergence criteria. The initial parameter estimates may be provided in terms of an initial "seed" model of the measured structure. Alternatively, the optical model may exist as pre-computed theoretical characteristics as a function of one or more discretized measurement parameters, i.e., a "library", that associates collections of parameters with theoretical optical characteristics. The "extracted" structural model has the structural parameters associated with the optical model which best fits the measured characteristics, e.g., in a least-squares sense.

Conrad (U.S. Pat. No. 5,963,329) use scatterometry to measure the line profile or topographical cross-sections. The direct application of Maxwell's equations to diffracting structures, in contrast to non-diffracting structures (e.g., unpatterned films), is much more complex and time-consuming, possibly resulting in either a considerable time delay between data acquisition and result reporting and/or the need to use a physical model of the profile which is very simple and possibly neglects significant features.

Scheiner et al. (U.S. Pat. No. 6,100,985) teaches a measurement method that is similar to that of Conrad, except that Scheiner's method uses a simplified, approximate optical model of the diffracting structure that does not involve direct numerical solution of Maxwell's equations. This avoids the complexity and calculation time of the direct numerical solution. However, the approximations inherent in the simplified model make it inadequate for grating structures that have period and line width dimensions comparable to or smaller than the illumination wavelengths.

In an alternative method taught by McNeil et al. (U.S. Pat. No. 5,867,276) the calculation time delay is substantially reduced by storing a multivariate statistical analysis model based on calibration data from a range of model structures. The calibration data may come from the application of Maxwell's equations to parameterized models of the structure. The statistical analysis is applied to the measured diffraction characteristics and returns estimates of the parameters for the actual structure.

The measurement method taught by McNeil uses diffraction characteristics consisting of spectroscopic intensity data. A similar method can also be used with ellipsometric data, using ellipsometric parameters such as tan ψ, cos Δ in lieu of intensity data. For example, Xinhui Niu in "Specular Spectroscopic Scatterometry in DUV Lithography," Proc. SPIE 3677, pp. 159, 1999, uses a library approach. The library method can be used to simultaneously measure multiple model parameters (e.g. linewidth, edge slope, film thickness).

In International (PCT) application publication No. WO 99/45340 by Xu et al. disclose a method for measuring the parameters of a diffracting structure on top of laterally homogeneous, non-diffracting films. The disclosed method first constructs a "reference database" based on a priori information about the refractive index and film thickness of underlying films, e.g., from spectroscopic ellipsometry or reflectometry. The reference database has "diffracted light fingerprints" or "signatures" (either diffraction intensities, or alternatively ellipsometric parameters) corresponding to various combinations of grating shape parameters. The grating shape parameters associated with the signature in the reference database that matches the measured signature of the structure are then reported as the grating shape parameters of the structure.

In International (PCT) application publication No. WO 02/065545 A2 by A. Sezginer, K. Johnson, and F. E. Stanke and entitled "Overlay Alignment Metrology Using Diffraction Gratings," alignment accuracy between two patterned layers is measured using a metrology target comprising substantially overlapping diffraction gratings formed in a test area of the layers being tested. An optical instrument illuminates all or part of the target area and measures the optical response. The instrument can measure transmission, reflectance, and/or polarization of the illumination and detected light. Overlay error or offset between those layers containing the test gratings is determined by a processor programmed to calculate an optical response for a set of parameters that include overlay error, using a model that accounts for diffraction by the gratings and interaction to the gratings with each others' diffracted field. The model parameters might also take account of manufactured asymmetries. The calculated and measured responses are iteratively compared and the model parameters changed to minimize the difference.

In International (PCT) application publication No. WO 02/069390 by Xinhui Niu and Nickhil Jakatdar and entitled "Grating Test Patterns And Methods For Overlay Metrology," a metrology is described for determining bias or overlay error in lithographic processes. The metrology includes a set of diffraction test patterns, optical inspection techniques using spectroscopic ellipsometer or reflectometer, and a method of test pattern profile extraction. The metrology uses a set of diffraction gratings as the test patterns and thin film metrology equipment, such as spectroscopic ellipsometer or spectroscopic reflectometer. The profiles of the test patterns in the two successive layers are analyzed. Overlay information are obtained after processing the profile data. In procedure, a line-on-line overlay grating test patterns structure is described in which a second layer mask is placed in the center of a clear line in a first layer mask. In a second procedure, a line-on-line overlay grating test patterns structure is described in which a second layer mask is placed in the center of a dark line in the first mask.

In International (PCT) application publication No. WO 02/24723 A2 by B. Brill, M. Finarov, and D. Scheiner and entitled "Lateral Shift Measurement Using An Optical Technique," a method is described for controlling layers alignment in a multi-layer sample, such as in semiconductor wafers based on detecting a diffraction efficiency of radiation diffracted from the patterned structures located one above the other in two different layers of the sample.

OCDR is used to measure surface profiles of wafers such as described by in the article "Optical Coherency-Domain Reflectometry : A New Optical Evaluation Technique" by R. C. Youngquist, S. Carr, and D. E. N. Davies, *Opt. Lett.*, 12. pp. 158 (1987). OCDR of prior art yields accurate information about the height profile of a surface but does not yield corresponding accurate information about the transverse location of features on a patterned wafer.

SUMMARY OF THE INVENTION

Methods and apparatus are disclosed for optical interferometric imaging and optical displacement interferometry of patterns, i.e., two- or three-dimensional patterns, that are generated in photoresist as a result of exposure induced changes in photoresist with or without post exposure treatment. The methods and apparatus are used for overlay and critical dimension (CD) metrologies and metrologies for measurement of properties of a lithography tool projection optic (PO) that are applicable to microlithography applications and integrated circuit (IC) fabrication. The metrologies may be used for example in advanced process control (APC), in determination of wafer induced shifts (WIS), in the determination of optical proximity corrections (OPC), in the determination and monitoring of the PO optic axis, and monitoring the PO aberrations. The determination of overlay errors, the determination of optical proximity corrections, the determination and monitoring of the PO optic axis, and the monitoring of the PO aberrations are obtained from measurements of properties of the patterns. With optical homodyne displacement interferometry, conjugated quadratures of optical fields generated by reflection/scattering or transmission/scattering of measurement beams by the patterns in exposed photoresist on wafers are measured interferometrically for the different metrology applications.

The measurement of the patterns in the exposed photoresist may be done with the photoresist coated wafer in situ in a lithography tool or exposure tool after the exposure of the photoresist coated wafer is completed, in situ in a lithography tool as a procedure performed in parallel with the exposure process of the photoresist coated wafer by the lithography tool, or with the exposed photoresist coated wafer removed from the lithography tool with or without post exposure treatment, e.g. post exposure bake or silylating.

Bleaching or changes of the imaginary part of the refractive index, changes in the real part of the refractive index, changes in the density, and changes in the thickness of a photoresist layer on exposure are well known phenomena which occur in many photoresists such as described in articles by A. Erdmann, C. Henderson, and C. G. Willson, *J. Appl. Phys.* 89, p 8163 (2001) entitled "Impact of exposure induced refractive index changes of photoresists on the photolithographic process," by H.-K. Oh, Y.-S. Sohn, M.-G. Sung, Y.-M. Lee, E.-M. Lee, S.-H. Byun,I. An, K.-S. Lee, and I.-H. Park, *Advances in Resist Technology and Processing XVI*, Proceedings of SPIE 3678, p 643 (1999) entitled "Refractive Index Change during Exposure for 193 nm Chemically Amplified Resist," and by A. Kewitsch and A. Yariv, *Appl. Phys. Lett.* 68, p 455 (1996). Erdmann, Henderson, and Willson report for example that the change on exposure of the real part of the refractive index in a series of diazonaphthoquinone-novolac (DNQ-novolac) photoresists can be both positive and negative and could take on values as large as 0.05. Similar changes of the imaginary part of the refractive index on exposure of photoresist are also reported. Changes in the density are noted for example in the cited article by Kewitsch and Yariv and changes in the thickness of photoresist on exposure are described for example in cited article by H.-K. Oh et al.

Various embodiments of the invention are distinct from prior art in that the techniques of linear displacement interferometry are used in the present invention to obtain information about relative locations in three dimensions of patterns and information about asymmetries of portions of the patterns wherein the patterns, two- or three-dimensional patterns, are generated by exposure induced changes in refractive index, density, and/or thickness of photoresist on a wafer with or without post exposure treatment for the overlay, CD, PO optic axis, and PO aberration metrologies. Various embodiments of the invention further distinguish themselves from prior art by measuring other properties of the amplitudes and phases, i.e., differential properties of conjugated quadratures, of fields reflected/scattered or transmitted/scattered by the portions of the patterns with or without post exposure treatment and inverting the measured other properties to obtain information about properties of the portions of the patterns in the photoresist on a wafer such as asymmetries caused by CMP. The amplitudes and phases contain two- or three-dimensional information about the patterns, such as the magnitudes of the exposure-induced changes. The prior art measures only intensities and/or ellipsometric properties of fields reflected and/or scattered by patterns in processed wafers and accordingly obtains information about overlay error of two patterns from properties of the measured intensities and/or ellipsometric properties in processed wafers.

Various embodiments are also distinct from prior art in that the high precision of the overlay, CD, PO optic axis, and PO aberration metrology embodiments do not require the analysis of fields of a beam generated by one or more reflections/scatterings by each of two stacked gratings such as in prior art. The associated analysis of the fields of beam generated by one or more reflections/scatterings by each of two stacked gratings for determination of overlay error is generally complex and lengthy. In comparison, the analysis of the relative phase information of various embodiments of the present invention may comprise a simple determination of relative displacements corresponding to a relative phase shift or to a particular phase shift value such as $2\pi$ or a spectral analysis such as a fast Fourier transform (FFT) to obtain high precision results.

The conjugated quadratures and differential conjugated quadratures are measured using interferometric techniques. Differential conjugated quadratures may be measured as a function of scattering angle in one or two dimensions, as a function of wavelength, and as a function of the polarization state of the measurement beam. The information about the relative location of a pattern generated by exposure induced changes in photoresist with or without post exposure treatment may be with reference to a second pattern on the same interface layer of a wafer, to a second pattern on a different interface layer of the wafer, to a relative reference frame established by a simultaneous measurement of an array of conjugated quadratures corresponding to an array of sites on the wafer, or to a reference frame of a lithography stage metrology system.

Various embodiments of the present invention are also distinct from prior art in that the different types of information about the conjugated quadratures may be obtained as joint measurements.

TIS is either eliminated or greatly reduced in measurements made using some embodiments of the present invention because the effects of optical aberrations of imaging systems used in interferometric metrology systems generally cancel out in relative phase measurements.

TIS is measured in some embodiments of the present invention without the complications introduced by WIS and by the errors introduced when using metrology tools of prior art to measure the properties of developed and etched wafers removed from the respective lithography tool.

Various embodiments of the present invention are also distinct from prior art in that a pattern, i.e., a pattern generated by exposure-induced changes in photoresist with or without post exposure treatment, that is being imaged may contain a single element or an array of elements wherein the number of elements is two or more. Accordingly, the size of the patterns used in the metrology systems some embodiments of the present invention can have areas of reduced sizes with linear dimensions of the order of $\lambda$ or larger.

Various embodiments of the present invention are also distinct from prior art in that the patterns under measurement are scanned for the presence of defects that could introduce an error in an overlay measurement, in a CD measurement, in the measurement of the location of the PO optic axis, or in the monitoring of the PO aberrations.

The calibration of the measurement scales used for the different metrologies based on various embodiments of the present invention are traceable to independently calibrated standards.

Various embodiments of the present invention are also distinct from prior art in that the interferometric metrologies may use bi- or quad-homodyne detection techniques or variants thereof to obtain joint measurements of arrays of conjugated quadratures or differential conjugated quadratures of fields reflected/or scattered or transmitted/scattered by patterns and/or defects of a wafer and the elements of arrays of the conjugated quadratures or differential conjugated quadratures are measured simultaneously leading to advantages of reduced sensitivity to vibrations and to a high throughput.

In addition, information about the properties of a feature in a pattern or a defect with respect to the real and complex components n and k, respectively, of the respective refractive index may be obtained by using different polarization states and/or wavelengths of measurement beams in the interferometric metrologies.

The procedures of at least some embodiments of the present invention require general knowledge of the feature geometry of patterns generated by exposure induced changes in photoresist with or without post exposure treatment and for certain of the metrologies knowledge of feature geometry of different process surfaces of wafers located below the photoresist. However, the procedures generally do not require detailed knowledge of the properties of the fields reflected/scattered or transmitted/scattered by the features of a reference or standard patterned wafer, e.g., angular distributions of reflected/scattered measurement beams or phase shifts introduced by reflections/scatterings or transmissions/scatterings of measurement beams, wherein the reference or standard wafer is one that meets requirements with respect to, for example, overlay errors, values of CDs, and presence of defects.

The lateral resolution used in detection of CD errors for features characterized by dimensions larger than the corresponding limiting optical resolution that could be used in the CD metrology can be matched respectively in various embodiments of the present invention to the typical size of defects so as to maximize the respective detection efficiency and can also be matched to dimensions of subsections of features that is optimum for use of CD errors in OPC analysis. The precision to which such CDs are measured can be sub-nanometer, the profile of a surface can be measured to an accuracy of the order of 0.1 nm, and the mean size of particle defects detected and the size of dimensions of the subsections of features measured may be for example of the order of 35 nm for a VUV measurement beam.

UV, VUV, and EUV measurement beams can be used effectively in various embodiments of the present invention for the different metrologies for the technology nodes of hp65 nm, hp45 nm, hp32 nm, and hp22 nm nodes as set out in the International Technology Roadmap for Semiconductors (ITRS), 2003 Edition.

At least some embodiments of the present invention are distinct from the metrologies described in commonly owned U.S. Provisional Patent Applications No. 60/568,774 (ZI-60) entitled "Apparatus And Methods For Measurement of Critical Dimensions Of Features And Detection Of Defects In UV, VUV, And EUV lithography Masks," No. 60/569,807 (ZI-61) entitled "Apparatus And Methods For Measurement Of Critical Dimensions Of Features And Detection Of Defects In UV, VUV, And EUV Lithography Masks," No. 60/573,196 (ZI-62) entitled "Apparatus And Methods For Overlay, Alignment Mark, And Critical Dimension Metrologies Based on Optical Interferometry," and No. 60/571,967 (ZI-63) entitled "Apparatus And Methods For Measurement Of Critical Dimensions Of Features And Detection Of Defects In UV, VUV, And EUV lithography Masks" wherein measurements are made of locations and properties of patterns or portions of patterns in processed wafers and not of patterns or portions of patterns in photoresist layers generated by exposure induced changes in the refractive index, density and/or thickness of the photoresist layer with or without post exposure treatment. Each of the four cited provisional applications are by Henry A. Hill and the contents of each of the four cited provisional applications are herein incorporated in the entirety by reference.

At least some embodiments of the present invention are further distinct from the metrologies described in cited U.S. Provisional Patent Applications No. 60/568,774 (ZI-60), No. 60/569,807 (ZI-61), No. 60/573,196 (ZI-62), and No. 60/571,967 (ZI-63) in that the location of a PO optic axis and/or the aberrations of the PO can be measured, the location of a PO optic axis and/or the aberrations of the PO can be measured within a short period of time, e.g., 0.1 seconds, after exposure of a respective site on a wafer and during the exposure cycle of the wafer, temporal changes in overlay errors can be measured during the exposure of a wafer, overlay errors can be measured within a short period of time, e.g., 0.1 seconds, after exposure of a respective site on a wafer, overlay errors can be measured without the processed wafer contributions of WIS, and the contribution of photoresist to WIS can be easily measured.

At least some embodiments of the present invention are in addition distinct from the metrologies described in cited U.S. Provisional Patent Applications No. 60/568,774 (ZI-60), No. 60/569,807 (ZI-61), No. 60/573,196 (ZI-62), and No. 60/571,967 (ZI-63) in that imaging properties such as the location of optic axis of an e-beam or ion-beam lithography tool can be measured, imaging properties such as the location of the optic axis of the e-beam or ion-beam lithography tool can be measured within a short period of time, e.g., 0.1 seconds, after exposure of a respective site on a wafer and during the exposure cycle of the wafer, and temporal changes in overlay errors can be measured during the exposure of a wafer.

In general, in one aspect, the invention features a method of processing a substrate on which a layer of photoresist has been applied. The method involves: exposing the layer of photoresist to radiation that carries spatial information to generate exposure-induced changes in the layer of photoresist that form a pattern having one or more features; and before developing the exposed photoresist, interferometrically obtaining measurements of the pattern in the exposed layer of photoresist for determining at least one of (1) locations of the one or more features of the pattern and (2) magnitudes of the exposure-induced changes.

In general, in another aspect, the invention features a method of processing a substrate on which a layer of photoresist has been applied. The method involves: exposing the layer of photoresist to patterned radiation to generate exposure-induced changes in the layer of photoresist which form patterns having one or more features; and before developing the exposed photoresist, interferometrically obtaining measurements of the pattern in the exposed layer of photoresist for determining locations of the one or more features of the pattern.

Other embodiments include one or more of the following features. Interferometrically obtaining measurements involves: for each spot of an array of spots on the layer of photoresist, directing a measurement beam at that spot to produce a return measurement beam; interfering the return measurement beam with a reference beam to generate an interference beam; and detecting the interference beam to generate an electrical interference signal value. The pattern is produced by exposure-induced changes in at lest one of the reflectivity of the photoresist, the index of refraction of the photoresist, the thickness of the photoresist, the density of the photoresist. Interferometrically obtaining measurements of the pattern in the layer of photoresist is performed concurrently with exposing the layer of photoresist to patterned radiation. The method also involves interferometrically obtaining second measurements of the pattern in the layer of photoresist for identifying defects on or in the layer of photoresist and using both the first-mentioned measurements and the second measurements to determine locations of the one or more features of the pattern. Interferometrically obtaining the second measurements involves using a differential interferometric microscopy system. Interferometrically obtaining the first-mentioned measurements involves using a linear displacement interferometric metrology system. The obtained measurements of the pattern in the exposed layer of photoresist are for determining locations of the one or more features of the pattern relative to corresponding features of a second pattern in a layer under the layer of photoresist. The method also further involves treating the layer of exposed photoresist prior to interferometrically obtaining measurements. Measuring is done in situ with exposing. Interferometrically obtaining measurements of the pattern involves interferometrically measuring properties of conjugated quadratures of optical fields generated by reflection/scattering or transmission/scattering of measurement beams by the pattern in exposed layer of photoresist. The method further involves analyzing relative phases of the measured conjugated quadratures to obtain relative locations of the one or more features. The properties of the conjugated quadratures of optical fields are one of: far-field properties of those optical fields; near-field properties of those optical fields; evanescent-field properties of those optical fields. Interferometrically measuring properties of conjugated quadratures of optical fields involves interferometrically measuring properties of amplitudes or phases of the conjugated quadratures of the optical fields. Interferometrically obtaining measurements of the pattern in the exposed layer of photoresist for determining locations of the one or more features of the pattern involves using either an interferometric confocal microscopy system or an interferometric non-confocal imaging system. Interferometrically obtaining measurements of the pattern in the exposed layer of photoresist for determining locations of the one or more features of the pattern involves scanning with an interferometric metrology system. The interferometric metrology system is a displacement interferometric metrology system. Interferometrically obtaining measurements of the pattern involves interferometrically measuring properties of conjugated quadratures of optical fields generated by backscattering of measurement beams by the pattern in exposed layer of photoresist.

An advantage of at least some embodiments of the present invention is an increase in information about properties of features of patterned wafers through the measurement of the conjugated quadratures and differential conjugated quadratures of fields reflected/scattered or transmitted/scattered by features generated in a photoresist layer by exposure induced changes in one or more of the refractive index, density and thickness of the photoresist layer with or without post exposure treatment.

Another advantage of at least some embodiments of the present invention is an increased signal-to-noise ratio for measured quantities through the use of interferometric techniques to measure the conjugated quadratures and the differential conjugated quadratures.

Another advantage of at least some embodiments of the present invention is the use in lithography tools wherein the exposure beam is an electromagnetic-beam, e-beam, or an ion-beam.

Another advantage of at least some embodiments of the present invention is reduced systematic errors in measured overlay errors, CDs, locations of the PO optic axis, and in monitoring the PO aberrations.

Another advantage of at least some embodiments of the present invention is reduced statistical errors in measured overlay errors, CDs, locations of the PO optic axis, and in monitoring the PO aberrations.

Another advantage of at least some embodiments of the present invention is the joint measurement of the conjugated quadratures and the differential conjugated quadratures.

Another advantage of at least some embodiments of the present invention is joint measurement of arrays of conjugated quadratures and differential conjugated quadratures that are each measured jointly.

Another advantage of at least some embodiments of the present invention is a reduced sensitivity of the measurement of overlay errors, CDs, locations of the PO optic axis, and in monitoring the PO aberrations to vibrations.

Another advantage of at least some embodiments of the present invention is a high throughput in measurement of overlay errors, CDs, locations of the PO optic axis, and in monitoring the PO aberrations and defect detection.

Another advantage of at least some embodiments of the present invention is that high precision is obtained in the overlay metrology using gratings that are spatially resolved by the interferometric imaging system.

Another advantage of at least some embodiments of the present invention is joint measurement of angular dependence on reflecting/scattering angle of differential conjugated quadratures.

Another advantage of at least some embodiments of the present invention is joint measurement of the dependence of the conjugated quadratures on the polarization states of measurement beams.

Another advantage of at least some embodiments of the present invention is the use of normal incidence and non-normal incidence measurement beams.

Another advantage of at least some embodiments of the present invention is that IR, visible, UV, VUV, and EUV measurement beams are used.

Another advantage of at least some embodiments of the present invention is the option to use a small site size of patterns in measurement of overlay errors, CD errors, locations of the PO optic axis, and in monitoring the PO aberrations, i.e., the site size may have linear dimensions of the order of $\lambda$ or larger.

Another advantage of at least some embodiments of the present invention is that overlay errors, CD errors, errors in locations of the PO optic axis, and errors in the PO aberrations can be used in APC.

Another advantage of at least some embodiments of the present invention is that measured CD errors can be used in OPC analysis.

Another advantage of at least some embodiments of the present invention is that overlay errors can be measured during an exposure cycle of an in process wafer with a minimal impact on throughput of a lithography tool.

Another advantage of at least some embodiments of the present invention is that overlay errors and other reference marks can be used to monitor the stability of a wafer during an exposure cycle of an in process wafer.

Another advantage of at least some embodiments of the present invention is that the overlay and the other reference mark metrology systems can be used as an off-axis pattern and reference mark detector in registering a wafer relative to a stage metrology system.

Another advantage of at least some embodiments of the present invention is that the overlay and the other reference mark metrology system can be used in monitoring the registration of a wafer/wafer chuck system at the exposure position of a dual stage lithography tool relative to the stage of the lithography tool or to a stage metrology system.

Another advantage of at least some embodiments of the present invention is that CDs of features of a patterned wafer can be measured.

Another advantage of at least some embodiments of the present invention is that sub-wavelength defects in or on a photoresist coated wafer can be detected.

Another advantage of at least some embodiments of the present invention is that the metrology systems can operate in both reflection and transmission modes.

Another advantage of at least some embodiments of the present invention is that the precision of overlay errors, of CD measurements, of measurements of locations of the PO optic axis, and of errors in monitoring the PO aberrations can be sub-nanometer.

Another advantage of at least some embodiments of the present invention is that the overlay, CD, and properties of PO metrology systems are of the non-contact type.

Another advantage of at least some embodiments of the present invention is that the measurements for overlay errors, CDs, and properties of PO can be made with a large working distance.

BRIEF DESCRIPTION OF THE DRAWINGS

In the following description of the different embodiments, many elements of the different embodiments perform like functions and are indicated with the same numerals in different respective figures of the embodiments.

DETAILED DESCRIPTION

Figure 1A:
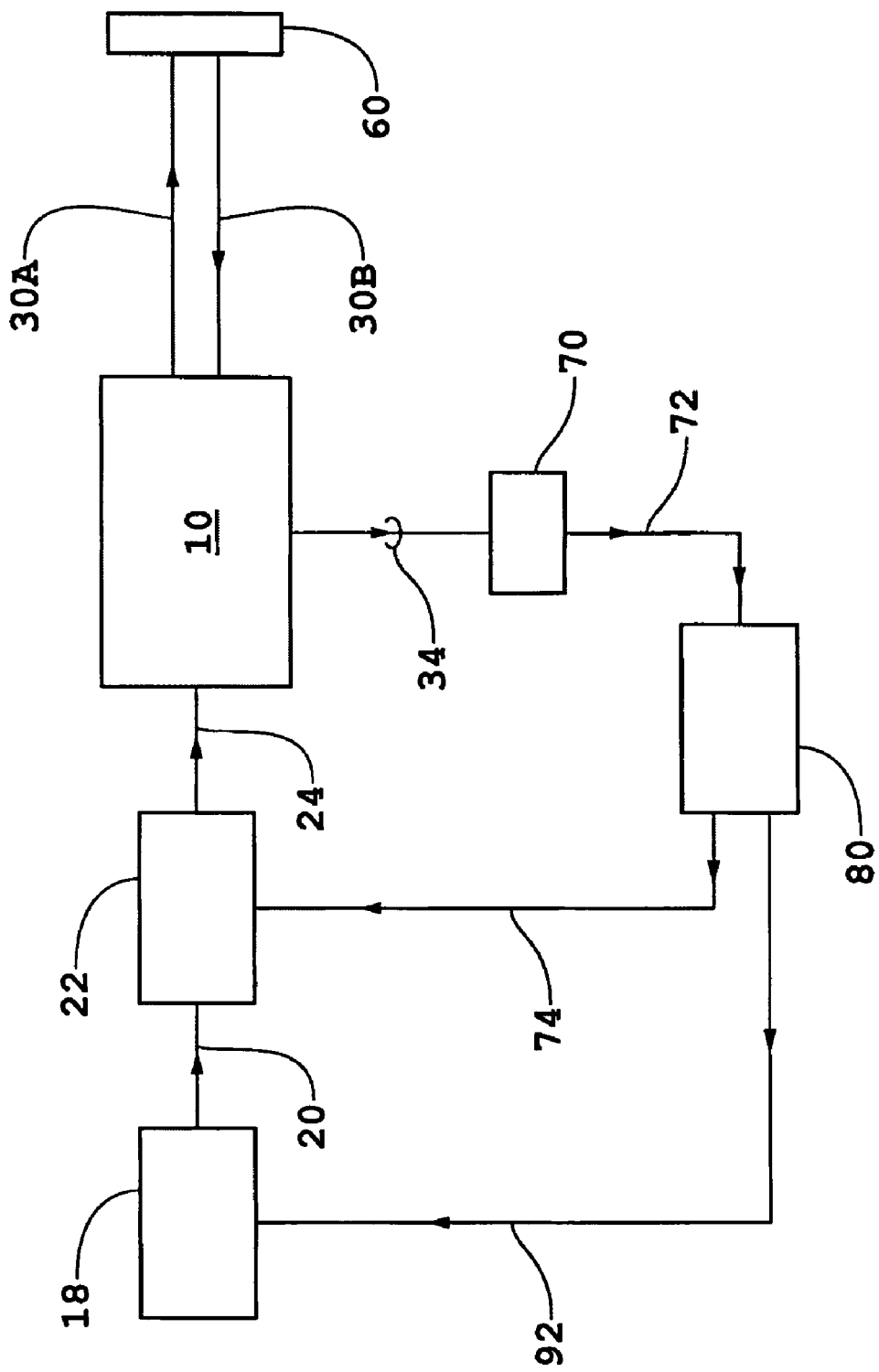
FIG. 1a is a diagram of an interferometric system.

Methods and apparatus are disclosed for optical interferometric imaging and for optical homodyne displacement interferometry of patterns that are generated in photoresist by an exposure tool as a result of exposure-induced changes in photoresist with or without post exposure treatment. The methods and apparatus are used for overlay metrologies, critical dimension CD metrologies, and metrologies for measurement of properties of a lithography tool projection optic PO that are applicable to microlithography applications and integrated circuit IC fabrication. The metrologies may be used for example in advanced process control APC, in determination of wafer induced shifts WIS, in the determination of optical proximity corrections OPC, in the determination and monitoring of the PO optic axis, and monitoring the PO aberrations. With optical homodyne displacement interferometry, conjugated quadratures of optical fields generated by reflection/scattering or transmission/scattering of measurement beams by the patterns in exposed photoresist on wafers are measured interferometrically for the different metrology applications.

The measurement of the patterns in the exposed photoresist may be done with the photoresist coated wafer in situ in a lithography tool after the exposure of the photoresist coated wafer is completed, in situ in a lithography tool as a procedure performed in parallel with the exposure process of the photoresist coated wafer by the lithography tool, or with the exposed photoresist coated wafer removed from the lithography tool with or without post exposure treatment, e.g. post exposure bake or silylating.

The relative phases of the measured conjugated quadratures are used, i.e., analyzed and/or inverted, to obtain information about relative locations to sub-nanometer accuracy of artifact features in an exposed undeveloped photoresist of a photoresist coated wafer for overlay error determination, CD determination, the determination and monitoring of the PO optic axis, measuring and monitoring the PO aberrations, and for other properties of pattern features. The optic axis of a PO and the aberrations of a PO may in general vary during the exposure cycle of a wafer by the lithography tool. The measurements may be in the UV, VUV, or EUV at an actinic wavelength of a lithography tool or at wavelengths either longer or shorter than the actinic wavelength. The decision as to whether use an actinic, a longer or a shorter wavelength is determined in part by the wavelength dependent properties of the exposure induced changes in the photoresist with or without post exposure treatment and the desired transverse and longitudinal spatial resolutions.

In addition, other properties of the conjugated quadratures, e.g., values of differential conjugated quadratures, are measured as required for example as a function of scattering angle and polarization states of respective reflected/scattered beams and inverted to obtain information about properties of features of the patterns in the exposed photoresist relevant to overlay error and CD determination such as asymmetries in the features caused by chemical mechanical polishing (CMP).

The measurement beams may exhibit at the features of the patterns in the exposed photoresist far-field properties using a low numerical aperture (NA) or high NA beam delivery system, evanescent-field properties using confocal or non-confocal imaging systems, and/or near-field properties using sub-wavelength apertures to generate the respective measurement beams. The measurement beams may comprise one or more components with different wavelengths in the IR, visible, UV, VUV, and EUV in one or more states of polarization.

The high precision of the overlay metrology system does not require the analysis of fields of beams generated by one or more reflections/scatterings by each of two stacked gratings such as in prior art. The associated analysis of the fields of beams generated by one or more reflections/scatterings by each of two stacked gratings is generally more complex and lengthy. In comparison, the analysis of the relative phase information may comprise a simple determination of displacements corresponding to a particular phase shift value or a spectral analysis such as a fast Fourier transform (FFT) for high precision results. The inversions of the phase information, amplitude profiles, and of the other properties of the conjugated quadratures are based on an iterative procedure using an application of scattering theory and an iteration of assumed feature properties.

Generally, speed of acquisition of phase information, speed of analysis of the phase information, and accuracy of information subsequently obtained exceeds in each of the applications of the present invention the corresponding performance of procedures of the present invention based on the other properties of the conjugated quadratures that require an inversion. Generally, speed of acquisition of the other properties of the conjugated quadratures, speed of inversion of the other properties of the conjugated quadratures, and accuracy of information subsequently obtained exceeds in each of the applications of the present invention the corresponding performance of prior art based on measurement and inversion of intensity properties of the corresponding reflected/scattered beams.

Also, the speed of acquisition of the intensity profiles and the analysis of the intensity profiles generally exceeds in each of the applications of the present invention the corresponding performance of prior art based on measurement and inversion of intensity properties of the corresponding reflected/scattered beams.

In one group of embodiments of the present invention, selected portions of a wafer, reticle, or mask, herein referenced simply as a wafer, are scanned by a displacement interferometric metrology system for a measurement of an error in an overlay, an error in a CD, of information about the location of the PO optic axis, and of information about the PO aberrations. The exposure beam of the respective lithography tool for various embodiments of the invention may be an electromagnetic beam, i.e., an optical beam, an e-beam, or an ion-beam. The presence of defects may introduce errors in the measurements made by the displacement interferometric metrology system wherein the defects may be for example in the form of either an error in the profile of an associated surface and/or an error in the form of a particle. After the measurements used in determining the errors in an overlay, the error in a CD, information about the location of the PO optic axis, or information about PO aberrations are obtained, an interferometric microscopy system, e.g., differential interferometric microscopy system, may be used in an end use application to determine if there are defects present whose effects must be accounted for.

The sensitivities of the results of the scan by the displacement interferometric metrology system and the subsequent measurements to determine the forms of errors are different with respect to each other. As a consequence, the results of the scan by the displacement interferometric metrology system and the subsequent measurements can be inverted if required and the nature with respect to form of each error determined. The differential interferometric microscopy systems may comprise either an interferometric confocal or interferometric non-confocal microscopy system.

In a second group of embodiments of the present invention, there are two complete independent scans of selected portions of a wafer. The first scan of the selected portions of the wafer is made using for example a differential interferometric microscopy system for the detection of defects in the forms for example of either an error in the profile of an associated surface and/or an error in the form of a particle. The first scan is followed by the second scan of the portions of the wafer by a displacement interferometric metrology system for measurements relevant to an error in an overlay, to an error in a CD, to information about the location of the PO optic axis, or to information about the PO aberrations. The results of the two scans are processed in the same manner as that of the first group of embodiments.

The embodiments of the second group of embodiments generally require a longer time for completion of an inspection of selected portions of a wafer with a concomitant reduction in throughput. However, the second group of embodiments may offer the better overall throughput when the inspection for errors in overlay, for errors in CDs, information about the location of the PO optic axis, or information about the PO aberrations and inspection for defects are used in APC.

Embodiments of the interferometric systems will first be described for embodiments comprising interferometric confocal microscopy systems and embodiments of interferometric non-confocal microscopy systems subsequently described.

In the interferometric metrology systems, an imaging system may be used in the generation of measurement beams, in the imaging of a wafer or substrate, and/or in the generation of reference beams. The imaging systems may be used in either a confocal configuration or a non-confocal configuration.

A general description is first given for the point spread function of an imaging system that may be used in the interferometric metrology systems to image spots or sites comprising features of a measurement object or comprising sub-wavelength apertures used when generating near-field probe beams and detecting near-field return measurement beams.

Point Spread Function

Figure 5:
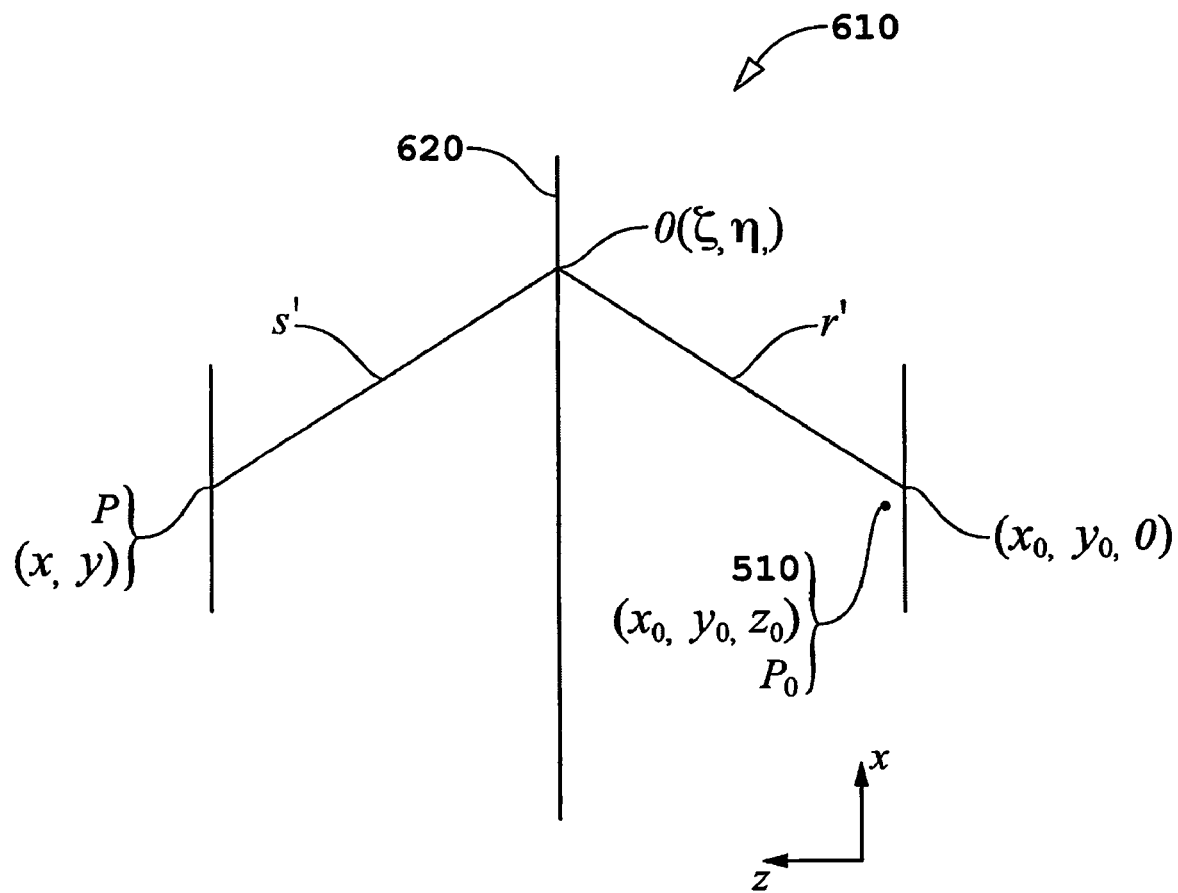
FIG. 5 is a schematic diagram of an imaging system comprising a single lens element.

The point spread function is generally designed so that the interferometric metrology systems yield relative phases of measured conjugated quadratures that are robust with respect to small displacements of a detector element in the image plane of the imaging system. The image comprises fields of measurement beams reflected/scattered or transmitted/scattered by features at an array of the spots on a measurement object. Each of the spots comprises an array of one or more sub-wavelength elements. In FIG. 5, the imaging system of a linear displacement interferometric metrology system is represented by an imaging system indicated by element number 610 comprising a single lens element 620. Also shown diagrammatically in FIG. 5 is the location of a single reflecting/scattering element 510. The complex amplitude U(P) in the image plane at point P with coordinates (x, y) for a source in the object space at point $P_0$ with coordinates $(x_0, y_0, z_0)$ is given by the equation $$U(P) = Ce^{ik(r'+s')} \int_\eta \int_\xi e^{-ik(p\xi+q\eta)+ik(\xi^2+\eta^2)\frac{z}{r'^2}} d\xi d\eta \quad (1)$$

where C is a constant, $\xi$ and $\eta$ are the x and y coordinates of point O in the pupil, $z_0$ is the location of point $P_0$ in the z direction from the plane from which r' is measured, $k=2\pi/\lambda$ is the free space wavenumber for free space wavelength $\lambda$, r' and s' are defined in FIG. 5, and $$p = \frac{x}{s'} + \frac{x_0}{r'}, \quad (2)$$
$$q = \frac{y}{s'} + \frac{y_0}{r'},$$

(see Born and Wolff, *Principles Of Optics*, Pergamon Press). The quantities p and q are also written as $$p = l - l_0 \quad (3)$$
$$q = m - m_0,$$

where $$l_0 = -\frac{x_0}{r'}, \quad l = \frac{x}{s'}, \quad (4)$$
$$m_0 = -\frac{y_0}{r'}, \quad m = \frac{y}{s'}.$$

The features of a spot comprising a single feature element or an array of elements forming a grating used in a overlay metrology system, a CD metrology system, a metrology system for acquiring information about the location of the PO optic axis, or a metrology system for acquiring information about the PO aberrations generally comprise high aspect ratios with respect to element lengths and separations. This property is used to advantage by specifying the pupil of the imaging system to be rectangular in cross-section with the boundaries of the rectangle aligned with the boundaries of the elements and selecting the aspect ratio of the rectangle to optimize performance of the linear displacement interferometric metrology system. The optimization of performance is used to obtain a high resolution in one dimension that is equivalent to a low $k_1 \geq \frac{1}{4}$ where the resolution is given by $k_1$ ($\lambda$/NA).

The use of a pupil that is rectangular in cross-section makes it possible to decouple the properties of the measured conjugated quadratures of the fields reflected/scattered by the elements with respect to the $\xi$ and $\eta$ coordinates. As a consequence, it is simpler to optimize a design of an imaging system in the linear displacement interferometric metrology system and makes it possible to achieve a better performance with respect to signal-to-noise ratios.

The component of a measurement beam that is generated by reflecting/scattering a measurement beam by the elements will generally comprise two components, a backscattered component and a forward scattered component. The conjugated quadratures of the backscattered component are measured interferometrically and accordingly, the phase of the conjugated quadratures contains information about the location of the array of elements in one or more of the x, y, and z directions.

Two procedures may be used to measure the backscattered component generated. One procedure is to restrict the range of values in $\xi$ in Equation (1) to eliminate both the forward reflected/scattered component and to either limit the contribution to the measured conjugated quadrature to a single diffraction order from the arrays of elements comprising more than one element or in the case of an array comprising a single element, to prevent the generation of undesired contributions to the reflected/scattered component by multiple reflections between widely separated elements.

Another procedure is to not eliminate the contribution of forward reflected/scattered component in the measured conjugated quadratures but to restrict the range of values in $\xi$ in Equation (1) to either limit the contribution to the measured conjugated quadrature to a single diffraction order from the arrays of elements comprising more than one element or in the case of an array comprising a single element, to prevent the generation of undesired contributions to the reflected/scattered component by multiple reflections between widely separated elements. The contributions of the forwarded/scattered components and the backscattered component are separated in the another procedure by the use of a form of phase sensitive detection such as described in commonly owned U.S. Provisional Patent Application No. 60/460,129 (ZI-51) and U.S. patent application Ser. No. 10/816,172 (ZI-51) wherein both are entitled "Apparatus and Method for Measurement of Fields of Forward Scattered/Reflected and Backscattered Beams by an Object in Interferometry," both of which are by Henry A. Hill, and the contents of the provisional and non-provisional patent applications are herein incorporated in their entirety by reference.

The subsequent general description of the properties in the image plane of a linear displacement interferometric metrology system will be restricted to the first procedure wherein the range of values in 4 is restricted, i.e., $\xi_2 > \xi_1$ and $\xi_1 \geq 0$ and $\xi_2$ and $\xi_1$ selected to either limit the contribution to the measured conjugated quadrature to a single diffraction order from the arrays of elements comprising more than one element or in the case of an array comprising a single element, to prevent the generation of undesired contributions to the reflected/scattered component by multiple reflections between widely separated elements.

Figure 6:
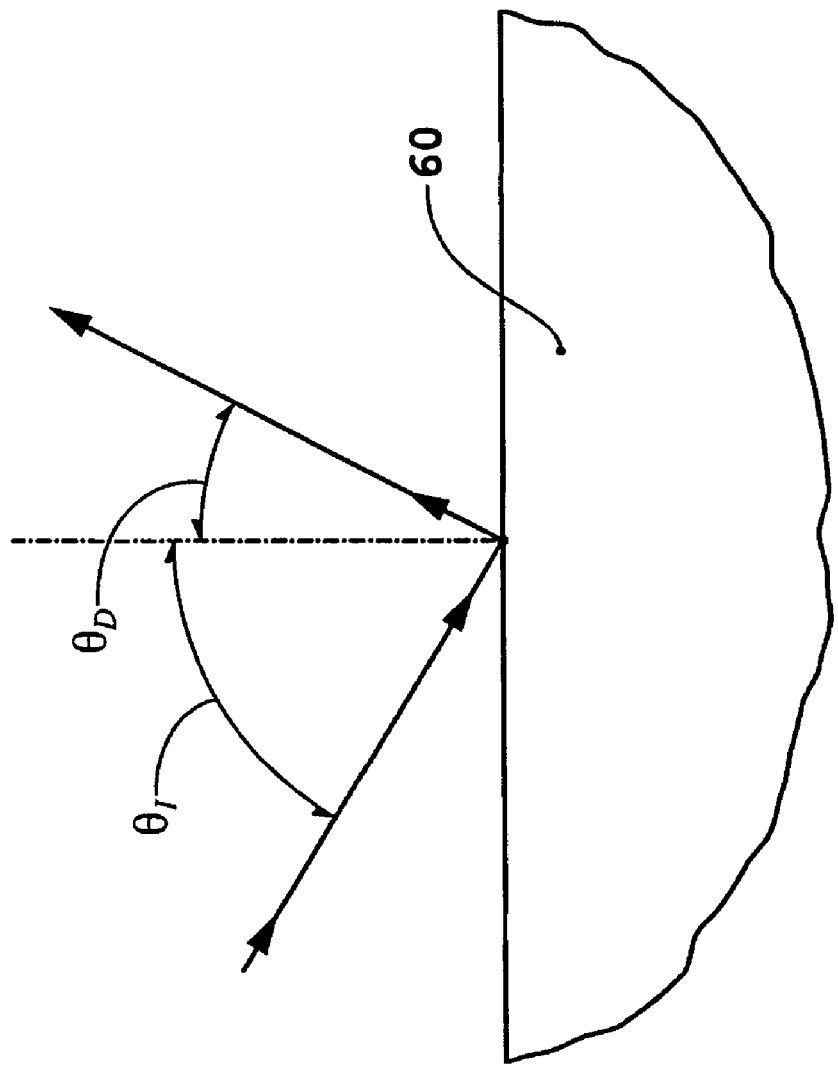
FIG. 6 is a diagram of the angles of incidence and diffraction of beams.

In the case of the array of elements comprising more than one element, i.e., the characteristic size of the spot being imaged is larger than the pitch of the array, the diffracted reflected/scattered beam will be preferentially diffracted at a particular angle. For a given optical wavelength $\lambda$ for a measurement beam, the particular angle at which a spatial frequency component of the substrate reflected/scattered beam by the spot will diffract the beam is given by a grating equation $$\Lambda[\sin\theta_I - \sin\theta_D] = m\lambda \quad (5)$$

where $\theta_I$ and $\theta_D$ are angles of incidence and diffraction as shown diagrammatically in FIG. 6, m is the diffraction order, and $\Lambda$ is the pitch or fundamental spatial wavelength component. It is evident from Equation (5) that in order to obtain the smallest $\Lambda$ for a given optical wavelength $\lambda$, that $$\theta_D \cong -\theta_I, \quad (6)$$

$$\theta_I \cong 1. \quad (7)$$

The width $\Delta\theta$ of the beam diffracted in a specific diffraction order by the array of elements will be determined by an autocorrelation length l, i.e., the corresponding linear dimension of the array of elements, of the reflected/scattered beams as $$\Delta\theta \cong \frac{\lambda}{l}\sec\theta_D. \quad (8)$$

The values of $(\xi_2+\xi_1)/2$ and $(\xi_2-\xi_1)$ are determined in this case by $\theta_D$ and $\Delta\theta$, respectively.

Figure 4A:
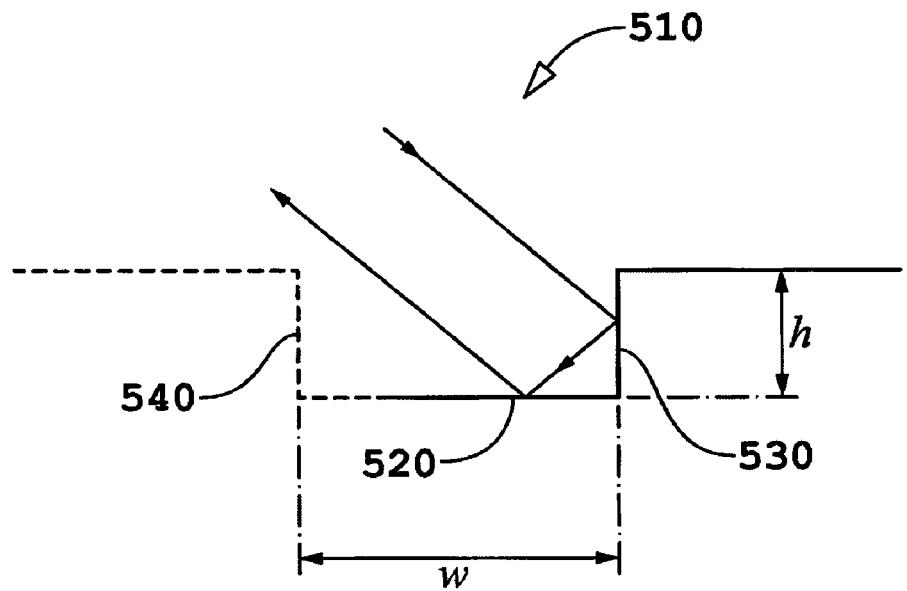
FIG. 4a is a diagrammatic representation of a Porro type prism formed by surfaces of a feature with a beam making two reflections in the Porro type prism.
Figure 4B:
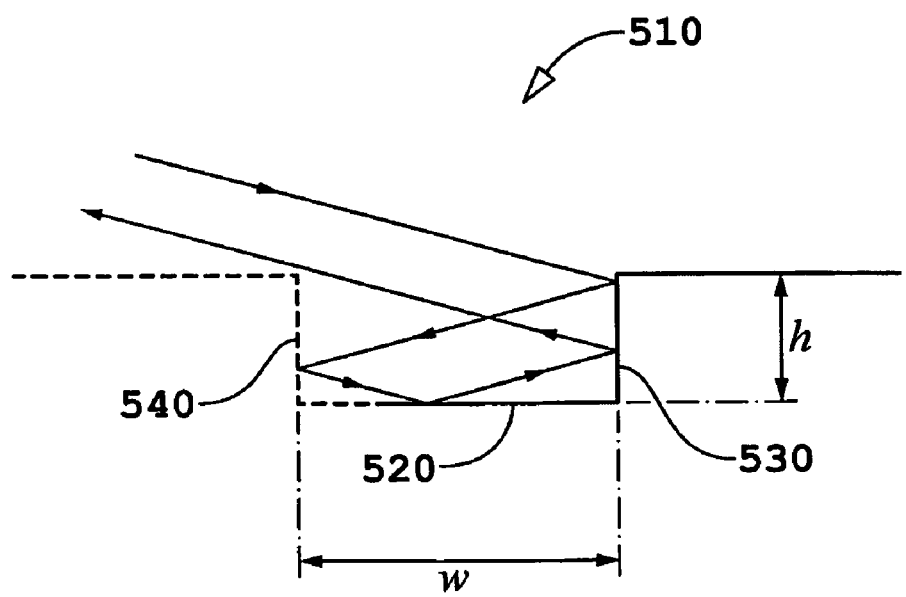
FIG. 4b is a diagrammatic representation of an open feature comprising a Porro type prism with a beam making four reflections at the surfaces of the open feature.

For an array of elements comprising a single element, one limiting value of $\xi_2$ will be determined in certain cases by the height of the wall of the feature relative to the respective width of the feature and consideration of the amplitude of a component generated by four reflections at surfaces of the feature (see FIG. 4b). For a height h and a width w (see FIG. 4b), the corresponding value limiting value $\xi_{2,lim}$ is given by the relationship $$\left(\frac{\xi_{2,\lim}}{s'}\right) = \left(\frac{3}{2}\right)\left(\frac{w}{h}\right). \quad (9)$$

For the example of h=100 nm and w=200 nm, the corresponding limiting value $\xi_{2,lim}$ is $$\xi_{2,\lim} = 3s' \quad (10)$$

with $$\arctan\left(\frac{\xi_{2,\lim}}{s'}\right) = 71.6 \text{ degrees.} \quad (11)$$

A value of 71.6 degrees corresponds to a NA=0.95 which is compatible with imaging system designs.

It is important to note that the relative large value for $\arctan(\xi_{2,lim}/s')$ makes it possible to achieve a significant spatial resolution at the feature being imaged corresponding to the $\xi$ direction.

Equation (1) is evaluated for U(P) based on a rectangular aperture at the pupil and using a power series representation for the respective integrand. The leading terms from that evaluation are $$U(P) = 4a_\xi a_\eta C e^{ik(r'+s') - ik\left[(p\xi_0 + q\eta_0) - \frac{1}{2}(\xi_0^2 + \eta_0^2)\frac{z_0}{r'^2}\right]} \times \quad (12)$$

$$\left\{\begin{array}{l} \operatorname{sinc} k\alpha_\xi a_\xi \operatorname{sinc} k\alpha_\eta a_\eta - k\left(\frac{\beta a_\xi^2}{2}\right)^2 f_2(k\alpha_\xi a_\xi) - \\ k\left(\frac{\beta a_\eta^2}{2}\right)^2 f_2(k\alpha_\eta a_\eta) - \\ 2k\left(\frac{\beta a_\xi^2}{2}\right)\left(\frac{\beta a_\eta^2}{2}\right) f_1(k\alpha_\xi a_\xi) f_1(k\alpha_\eta a_\eta) + \ldots + \\ i\left[k\left(\frac{\beta a_\xi^2}{2}\right) f_1(k\alpha_\xi a_\xi) + k\left(\frac{\beta a_\eta^2}{2}\right) f_1(k\alpha_\eta a_\eta)\right] + \ldots \end{array}\right\}$$

where $$\beta = \frac{z_0}{r'^2}, \quad (13)$$

$$\xi_0 = \frac{(\xi_2 + \xi_1)}{2}, \quad \eta_0 = \frac{(\eta_2 + \eta_1)}{2},$$

$$\alpha_\xi = p - \xi_0\beta, \quad \alpha_\eta = q - \eta_0\beta,$$

$$a_\xi = \frac{(\xi_2 - \xi_1)}{2}, \quad a_\eta = \frac{(\eta_2 - \eta_1)}{2}.$$

and $$f_1(k\alpha a) = \operatorname{sinc} k\alpha a - 2\left[\frac{\cos k\alpha a - \operatorname{sinc} k\alpha a}{(k\alpha a)^2}\right] \quad (14)$$

$$= \frac{1}{3} - \frac{(k\alpha a)^2}{5} + \ldots,$$

$$f_2(k\alpha a) = \operatorname{sinc} k\alpha a + 4[\cos k\alpha a - 3f_1(k\alpha a)] \quad (15)$$

$$= \frac{1}{5} + \ldots$$

The properties of the measurement and reference beams are described in the context of specific embodiments of the present invention. However, it is appropriate to describe here a very general property that is achieved through the design of the reference beams used in the linear displacement interferometric metrology systems. The very general property of various embodiments of the present invention is that the reference beam is generated with properties such that the phase of conjugated quadratures corresponding to the interference cross-term between the reference beam and the reflected/scattered measurement beam from a given feature in the electrical interference values generated by detection of mixed output beams of the linear displacement interferometric metrology systems has no dependence on either x or y. The phase term in U(P) given by Equation (12) that is a function x is the term containing p in the $ik(p\xi_0+q\eta_0)$ phase term. Thus the x dependence of a phase term for the reference beam must be equal to $ikx\xi_0/s'$ in order to achieve the very general property.

This is an important feature since the phase represented in conjugated quadratures is a function only of the reflecting properties and location of the feature in addition to a fixed offset error in the linear displacement interferometric metrology systems. A corollary statement is that the accuracy to which the location of a surface of an open or filled transparent feature can be measured is not affected by displacements of a pinhole corresponding to a detector or of a detector pixel used in measuring the respective conjugated quadratures.

The spots on the wafer that are being examined may contain a single pattern element or an array of two or more pattern elements in the form for example of a grating. It is beneficial to further describe the application of the some embodiments of the present invention to the two cases from both a pedagogical perspective and because the respective processing of measured conjugated quadratures can be formally different in certain aspects.

Location Of Feature: Single Element Type

The measurement of an error in an overlay, an error in a CD in a spot, information about the location of the PO optic axis, or information about the PO aberrations comprising a single pattern feature is based in part on a linear displacement interferometric measurement such as described in cited U.S. Provisional Patent Applications No. 60/568,774 (ZI-60), No. 60/569,807 (ZI-61), No. 60/573,196 (ZI-62), No. 60/571,967 (ZI-63), No. 60/602,999 (ZI-64), No. 60/618,483 (ZI-65) and No. 60/624,707 (ZI-68). Provisional Patent Applications No. 60/602,999, No. 60/618,483, and No. 60/624,707 are each entitled "Sub-Nanometer Overlay, Critical Dimension, And Lithography Tool Projection Optic Metrology Systems Based On Measurement Of Exposure Induced Changes In Photoresist On Wafers" and are by Henry A. Hill. The feature is formed by exposure induced changes in one or more of the refractive index, density, and thickness of the photoresist on a substrate with or without post exposure treatment, e.g. post exposure baking, vacuum treatment, and silylating. The feature may be written in the scribe-lines of the wafer and the spatial properties of the feature designed optimally for overlay metrology, CD metrology, location of PO optic axis metrology, PO aberration metrology, TIS metrology, WIS metrology, or APC.

A defect in the reflecting substrate 60 in the form of a foreign particle will introduce an error in inferred position of the feature in addition to the error introduced by an error in either the profile of the respective surface and/or in a respective CD associated with the feature. Thus a detected error in the relative location of a feature may be due to either an error in the physical location and/or due to the presence of a defect or an error in the height profile of a respective surface. Accordingly, it is necessary to examine the feature with a different diagnostic tool in order to isolate the contribution of an error in a CD to the linear displacement measurement, i.e., if there is detected an error in the apparent location of feature, a check may be required to eliminate the possibility that a defect exists in the horizontal surface profile or in the form of a particle that may be generating the detected error in part or in whole.

The different diagnostic tool comprises a differential interferometric confocal and/or an interferometric non-confocal microscopy system preferentially operating in a dark field mode. The differential interferometric microscopy systems may in addition be used to detect defects in any one of the reflecting surfaces of a mask, i.e., a reflecting substrate, the surface of a buffer, the surface of a phase-shifting layer, and/or the surface of an absorber at different points in the fabrication of the mask.

A CD corresponding to the spacing between two opposing sides of a feature in the exposure induced changes in the photoresist with or without post exposure treatment are measured when using the linear displacement interferometric metrology systems by comparing the respective locations of the respective sides of the feature. Thus the measurement of the CD is a differential technique. As a consequence, the value of the measured CD is independent of the refractive indices of the media forming the surfaces of the open or filled transparent feature.

The pitch of a parallel array of elongated features corresponding to the spacing of two contiguous features are measured using the linear displacement interferometric metrology systems by comparing the respective locations of the respective elements. Thus the measurement of the pitch is a differential technique. As a consequence, the value of the measured pitch is independent of the refractive indices of the media forming the features when the features are identical with respect to composition.

The calibration of the pitch scale is based on the use of a reference or standard parallel array and/or on the use of a stage metrology system. The accuracy of a pitch measurement will depend in part on the accuracy to which the surface profile of the array of horizontal reflecting surfaces in which the features are formed are measured or known. The profile can be measured.

Multiple Element Pattern: Grating response

The point spread function represented by Equation (12) for the imaging system of a spot can be used to derive the dependence of phase $\Phi_1$ of a measured conjugated quadrature of differential conjugated quadrature on the translation of a grating pattern through the spot being imaged by the interferometric imaging system. The grating pattern is formed either in the photoresist layer by exposure induced changes in one or more of the refractive index, density and thickness of the photoresist layer on a substrate or in a process layer located below the photoresist layer. The grating pattern formed in the photoresist may be written in the scribe-lines of the wafer and the spatial properties of the grating pattern designed optimally for overlay metrology, CD metrology, location of PO optic axis metrology, PO aberration metrology, TIS metrology, WIS metrology, or APC. That dependence of phase $\Phi_1$ can be expressed as $$\Phi_1 = -k\left[(p\xi_0' + q\eta_0') - \frac{1}{2}(\xi_0'^2 + \eta_0'^2)\frac{z_0}{r'^2}\right] + \arctan\left\{\frac{k\beta(a_\xi'^2 + a_\eta'^2)^2}{6\operatorname{sinc}k\alpha_\xi' a_\xi' \operatorname{sinc}k\alpha_\eta' a_\eta'}\right\} + \ldots \quad (16)$$

where $\xi'_0$ is determined by $\theta_D$, $a'_\xi$ is determined by the size of the spot that is being imaged and accordingly $\Delta\theta$. Also the point spread function represented by Equation (12) can be used to derive the dependence of the phase $\Phi_2$ of a measured conjugated quadrature or differential conjugated quadrature on the translation of a grating pattern through the spot being imaged by the interferometric imaging system including the effects of the imaging system for delivering the measurement beam to the spot with the result $$\Phi_2 = k\left[\frac{(x_0(\xi_0 + \xi_0') + y_0(\eta_0 + \eta_0'))}{r'}\right] + k\frac{1}{2}(\xi_0^2 + \xi_0'^2 + \eta_0^2 + \eta_0'^2)\frac{z_0}{r'^2} + \arctan\left\{\frac{kz_0}{6\operatorname{sinc}k\alpha_\xi a_\xi \operatorname{sinc}k\alpha_\eta a_\eta}\frac{(a_\xi^2 + a_\eta^2)}{r'^2}\right\} + \ldots + \arctan\left\{\frac{kz_0}{6\operatorname{sinc}k\alpha_\xi a_\xi' \operatorname{sinc}k\alpha_\eta a_\eta'}\frac{(a_\xi'^2 + a_\eta'^2)}{r'^2}\right\} + \ldots \quad (17)$$

where $\xi_0$ is determined by $\theta_I$ and $a_\xi$ will be set by the NA of the input beam delivery system of the measurement beam.

Sensitivity: Displacement $x_0$ In Terms of $\Phi_2$

The evaluation of the sensitivity of $x_0$ in terms of $\Phi_2$ is obtained from Equation (17) with the result $$x_0 = \lambda \left( \frac{r'}{\xi_0 + \xi_0'} \right) \left( \frac{\Phi_2}{2\pi} \right) + \ldots \tag{18}$$

where $$\frac{1}{3} \leq \left( \frac{r'}{\xi_0 + \xi_0'} \right) \leq 1. \tag{19}$$

The ratio of the pitch $\Lambda$ of a grating to the wavelength $\lambda$ is $$\frac{\Lambda}{\lambda} = \frac{r'}{\xi_0 + \xi_0'} + \ldots . \tag{20}$$

Therefore the measurement of the phase $\Phi_2$ to an accuracy of 6 milliradian for a $\lambda=200$ nm and a $\Lambda=100$ nm would yield a relative position accuracy of 0.1 nm mod $\Lambda$_for the portion of the grating in the spot. The displacement redundancy of $\Lambda$ is a consequence of the phase redundancy of $2\pi$ in $\Phi_2$.

Measurement Of Grating Pitch $\Lambda$

The average pitch $\Lambda$ of the portion of the grating in the spot is measured as the change in displacement $x_0$ that will produce a $2\pi$ phase shift in $\Phi_2$.

Location Of A Feature: Grating Type

The relative location of an feature of the grating type is determined by first scanning the respective portion of wafer corresponding to the feature with two different feature metrology system configurations and recording the respective displacements of $x_0$ as a function of $\Phi_0$. The values of $\theta_I$ and $\theta_D$ for the two different configurations of the interferometric imaging system of the metrology system are equal in magnitude, respectively, but have opposite signs, respectively. The displacements in $x_0$ are measured by the stage metrology system of the lithography tool for which information about the location of the feature is being determined. It is assumed herein that the performance with respect to accuracy of the lithography stage metrology system matches the accuracy required to meet the accuracy of the overlay budget of the lithography tool/specific process.

The grating type feature is formed either in the photoresist layer by exposure induced changes with or without post exposure treatment in one or more of the refractive index, density and thickness of the photoresist layer on a substrate or in a process layer located below the photoresist layer. The grating type feature formed in the photoresist may be written in the scribe-lines of the wafer and the spatial properties of the grating pattern designed optimally for overlay metrology, CD metrology, location of PO optic axis metrology, PO aberration metrology, TIS metrology, WIS metrology, or APC.

The location of the feature is obtained as the average value of the two measured values of $x_0$ if the spot contains a single scattering element and the average value of $x_0$ mod $\Lambda$ if the spot contains a portion of a grating. The offset error in the case of the spot containing a single scattering element is calibrated by using a pair of features such as Porro type prism elements on a calibration wafer separated by a distance larger than the size of the spot and the separation of the two features measured by an independent procedure. The independent procedure may be based for example on measurements with a scanning Atomic Force Microscope (AFM).

The removal of the redundancy with respect to $\Lambda$ is achieved by incorporating one or more additional gratings wherein the relative values of the pitches of the additional gratings form for example a geometric progression, i.e., 1, 2, 4, 8, . . . , and the locations of each of the additional gratings are determined mod respective values of pitch. The number of additional gratings (N−1) required for each of two coordinate system axes will be determined by the ratio of the linear dimension of the spot to $\lambda$. Accordingly, N≥3.

The measurements of the respective values of $x_0$ and corresponding values of $\Phi_0$ are obtained simultaneously for the one or more gratings and as a consequence, the additional measurements required to remove the pitch redundancy does not affect the throughput of the respective lithography tool.

The area required for the grating and the additional gratings is approximately $\geq (N\lambda)_x (N\lambda)_y$ depending on the linear dimensions of the spot where the subscripts refer to the x and y axes of a coordinate system. For the example of $\lambda=200$ nm and $N=4$, the area required for the grating and additional gratings is approximately $(N\lambda)^2=0.64$ $(\mu m)^2$.

Relative Location of Two Gratings Located on Same Photoresist Layer of Wafer

The relative location of two gratings located on the same photoresist layer of a wafer is determined by scanning the respective portions of wafer corresponding to the two gratings and recording the spatial separation in $x_0$ that corresponds to a change in $\Phi_0$ mod $2\pi$. The relative location of the two gratings corresponds to the measured spatial separation in $x_0$ mod $\Lambda$. The pitch redundancy generally will not present a problem when the measured separation mod $\Lambda$ is used in an overlay metrology system. If however it is desired to remove the pitch redundancy, an array of additional gratings may be used in the manner described herein in the section entitled "Location Of A Feature: Grating Type"_for the removal of the pitch redundancy encountered in the feature position determination.

If the profile of the wafer surface is not flat, there will be an error introduced in the measured spatial separation in $x_0$ mod $\Lambda$. The sensitivity function $\partial \Phi_2 / \partial z_0$ is obtained from Equation (17) with the result $$\frac{\partial \Phi_2}{\partial z_0} = k \frac{1}{2} [\xi_0^2 + \xi_0'^2 + \eta_0^2 + \eta_0'^2] \frac{1}{r'^2} + \tag{21}$$
$$\frac{k}{6 \operatorname{sinc} k\alpha_\xi a_\xi \operatorname{sinc} k\alpha_\eta a_\eta} \left[ \frac{(a_\xi^2 + a_\eta^2)}{r'^2} + \frac{(a_\xi'^2 + a_\eta'^2)}{r'^2} \right] + \ldots$$

evaluated at $z_0=0$. The difference in the height of the surface of the wafer at the sites of the two gratings is measured by the use of a differential interferometric confocal and/or an interferometric non-confocal microscopy system preferentially operating in a dark field mode. The differential interferometric microscopy systems are such as described herein in the section entitled "Differential Interferometric Microscopy Systems." The differential interferometric microscopy systems may in addition be used to detect defects at either of the two sites.

The measured difference in height and the sensitivity function $\partial\Phi_2/\partial z_0$ given by Equation (21) is used to compute the correction that needs to be made to the spatial separation in $x_0$ to obtain a corrected value of the separation of the two gratings.

The results of the relative locations are used in an overlay, CD, PO optic axis, and PO aberration, TIS, and WIS metrology systems and can further be used in APC. The results of CD measurements can be used in OPC.

Figure 1B:
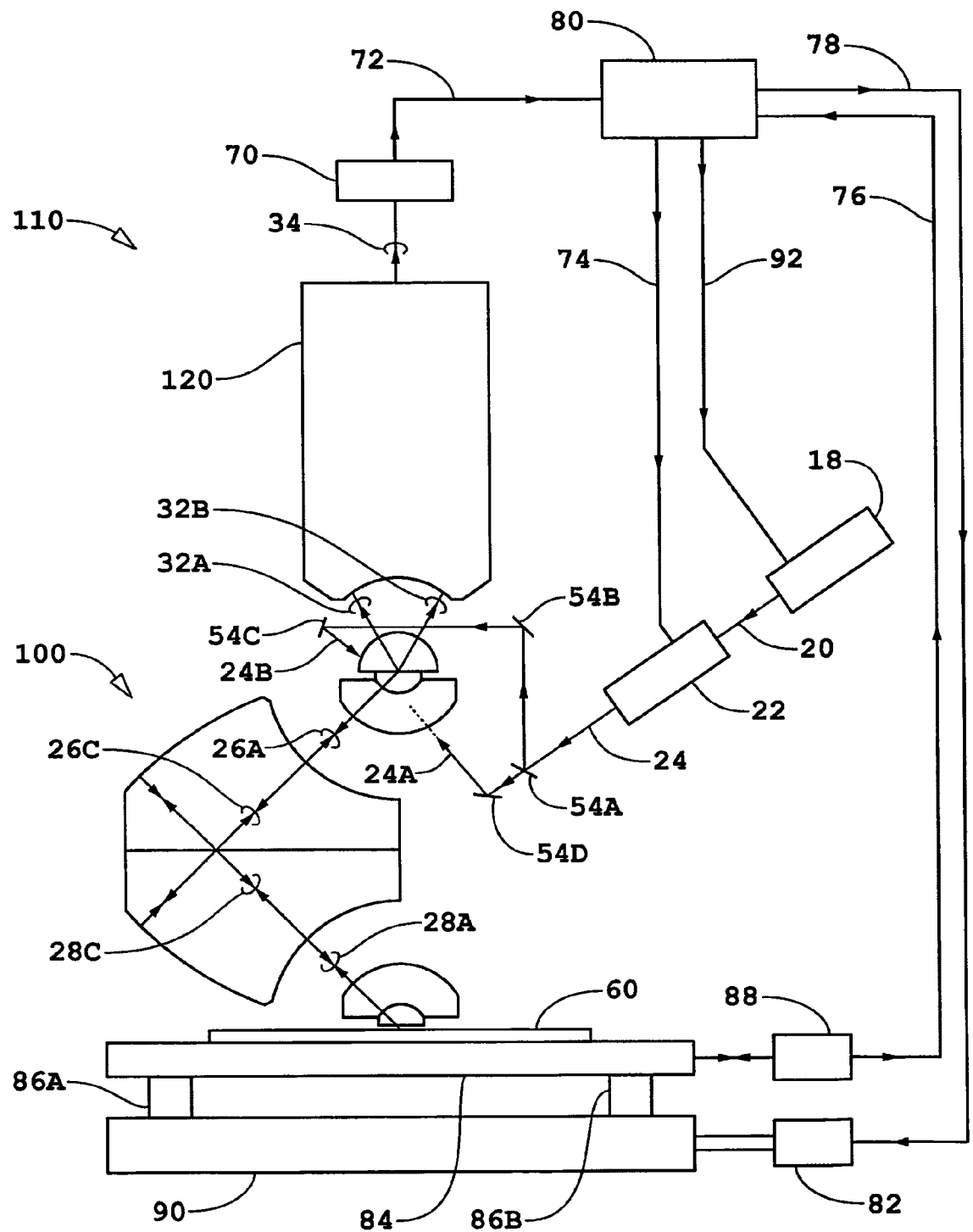
FIG. 1b is a diagram of an interferometric metrology system comprising a catadioptric imaging system.
Figure 1C:
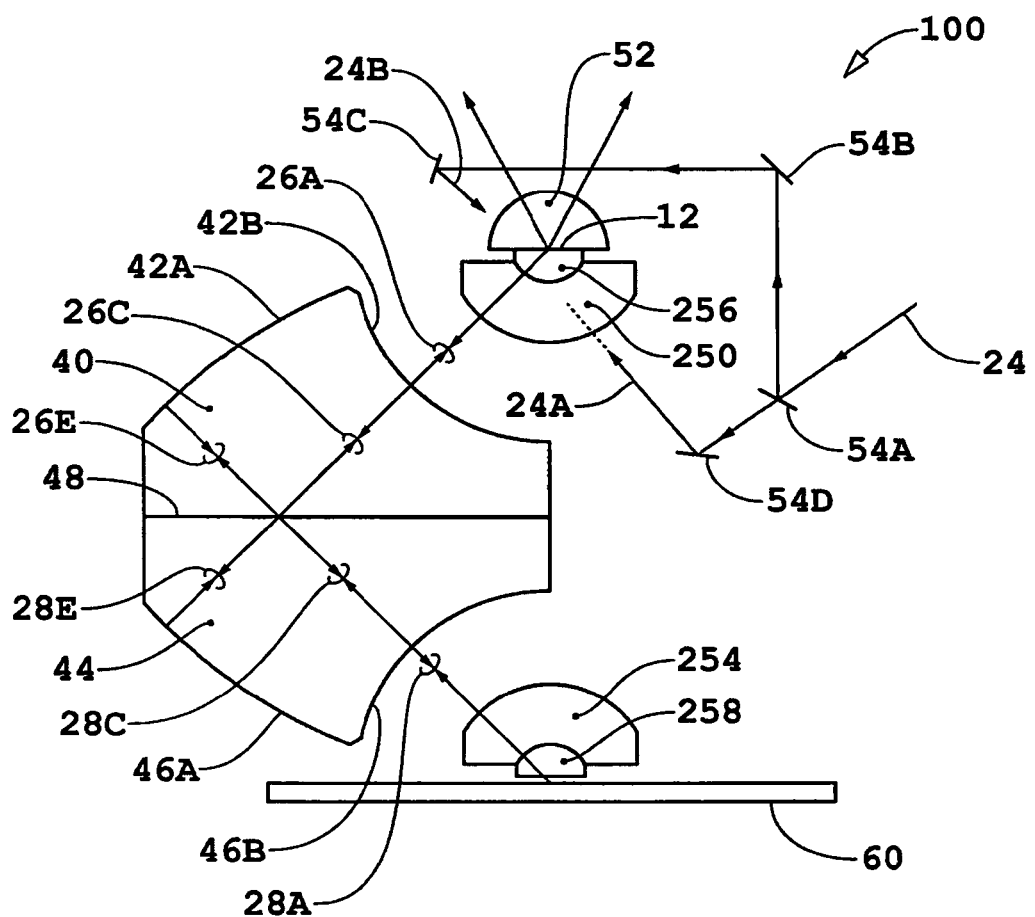
FIG. 1c is a diagram of a catadioptric imaging system.
Figure 1D:
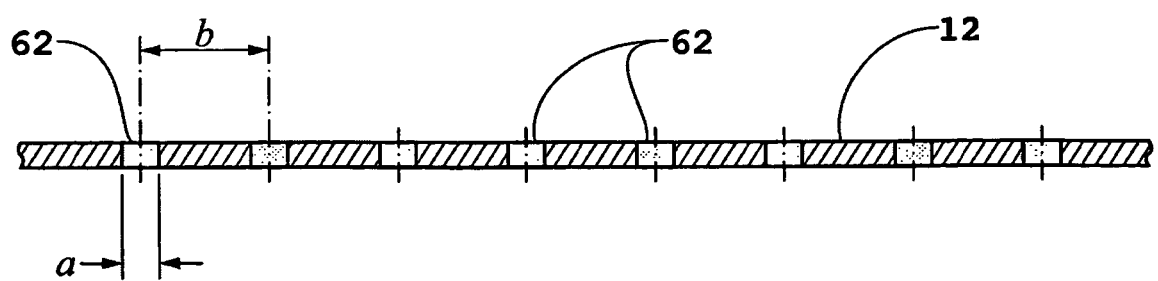
FIG. 1d is a diagram of a pinhole array beam-splitter.
Figure 1E:
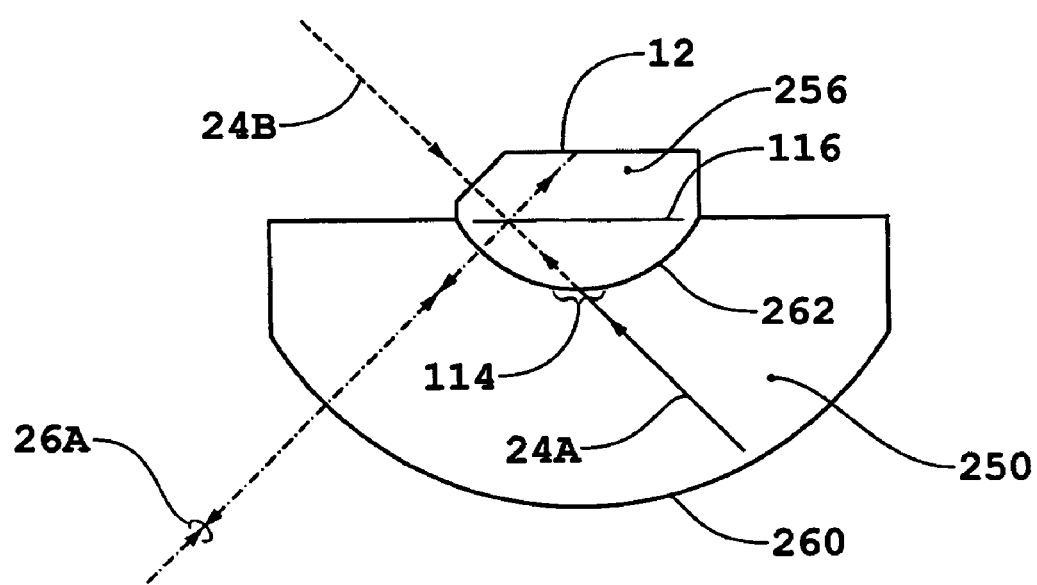
FIG. 1e is a diagram of a beam-splitter system for introducing measurement and reference beams into an interferometric metrology system.
Figure 1F:
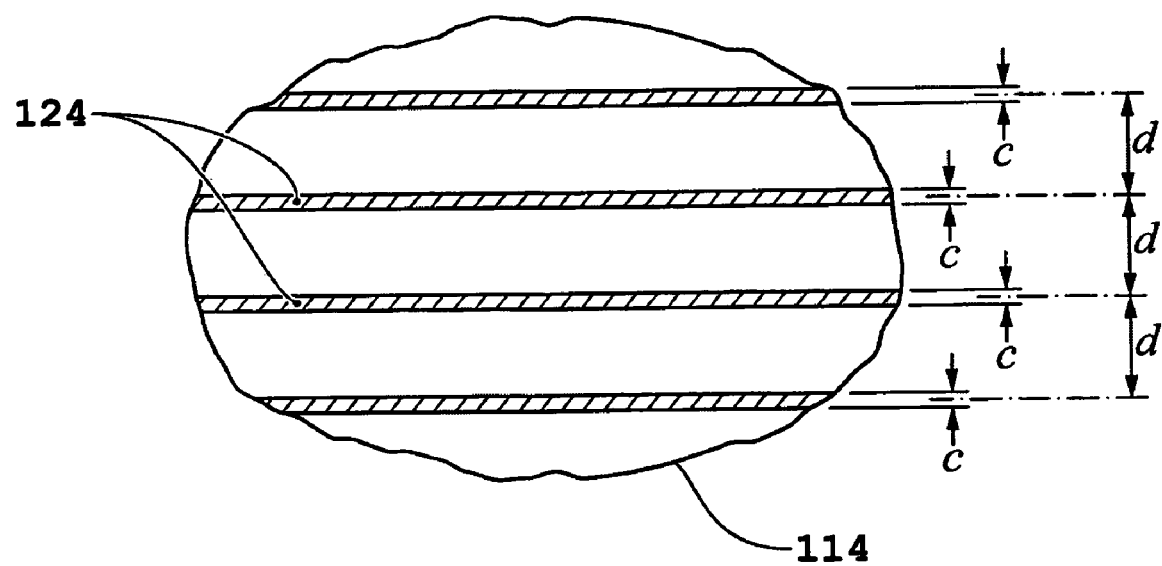
FIG. 1f is a diagram of a beam-splitter comprising an array of parallel slits.
Figure 1G:
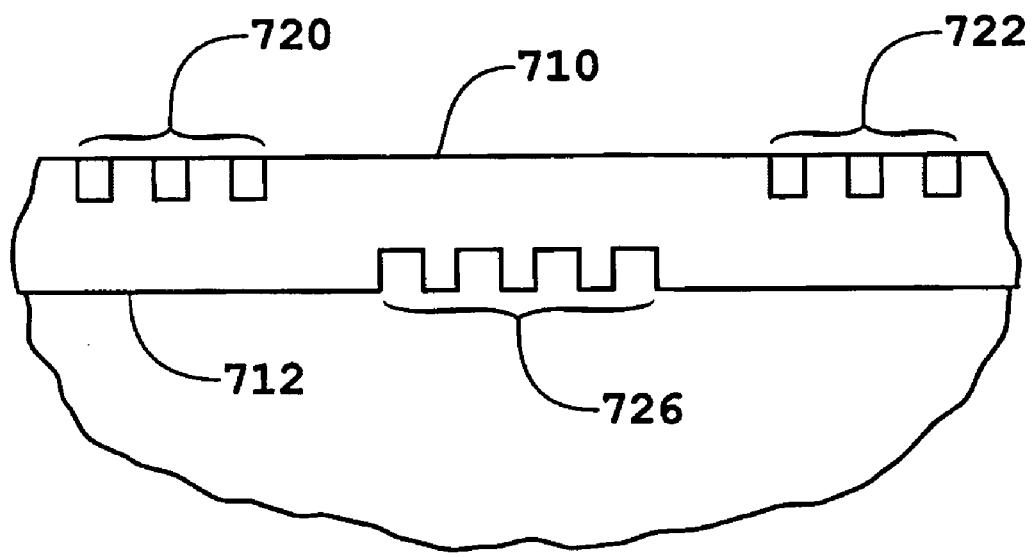
FIG. 1g is a diagram of gratings located on two different process layers of a wafer that are not superimposed.

Relative Location of Non-Superimposed Gratings Located on Two Different Process Layers of Wafer The relative location of non-superimposed gratings located on different process layers of a wafer such as shown in FIG. 1g is determined from measurements obtained by scanning the respective portions of wafer corresponding to two gratings and recording the spatial separation in $x_0$ that corresponds to a change in $\Phi_0$ mod $2\pi$ for two different configurations of the respective metrology system. The top process layer comprises the photoresist layer. The values of $\theta_I$ and $\theta_D$ for the two different configurations of the interferometric imaging system of the metrology system are equal in magnitude, respectively, but have opposite signs, respectively. The displacements in $x_0$ are measured by the stage metrology system of the lithography tool for which information about the location of the alignment mark is being determined. It is assumed herein that the performance with respect to accuracy of the lithography stage metrology system matches the accuracy required to meet the accuracy of the overlay budget of the lithography tool/specific process.

With reference to FIG. 1g, two gratings 720 and 722 are located in photoresist layer 710 and grating 726 is located laterally in between gratings 720 and 722 in process layer 712. Gratings 720 and 722 are generated by exposure induced changes in the photoresist with or without post exposure treatment.

Different pinholes of pinhole array 12 are used to obtain the respective measured values of $\Phi_0$ wherein the portion of the interferometric imaging system imaging the grating located on the interior process layer is compensated for the aberrations introduced by the object space being located interior to the surface of the wafer. The compensation uses the technique described in commonly owned U.S. Provisional Patent No. 60/444,707 (ZI-44) and U.S. patent application Ser. No. 10/771,785 (ZI-44) entitled "Compensation for Effects of Mismatch in Indices of Refraction at a Substrate-Medium Interface in Confocal and Interferometric Confocal Microscopy" wherein both are to Henry A. Hill and the contents of both the provisional and non-provisional patent applications are herein incorporated in their entirety by reference.

The pitch redundancy generally will not present a problem when the measured separation mod $\Lambda$ is used in an overlay metrology system. If however it is desired to remove the pitch redundancy, an array of additional gratings may be used in the manner described herein for the removal of the pitch redundancy described herein in the section entitled "Location of a Feature; Grating type".

The relative location of the two gratings is obtained as the average value of the two measured values of $x_0$ if the spots each contain a single scattering element and the average value of $x_0$ mod $\Lambda$ if the spots each contain a portion of a grating.

There may be an offset error as a result of the affect of imaging of a spot interior of the wafer in each of the two scans of the wafer. However, the offset error will cancel out to a high level in computing the average of the two measured values of $x_0$. The degree to which the offset errors cancel out can be checked by adapting the procedure described herein in the section entitled "Location of an Alignment Mark: Grating type" for spots comprising a single scattering element. In this case, the independent procedure can be for example based on a Scanning Electron Microscope (SEM).

A higher level of cancellation of the offset error can be achieved by using a set of an even number of gratings on one process layer and an odd number of gratings on the second process layer with the gratings on the two process layers interleaved transversely such as shown in FIG. 1g.

If the profiles of either or both of the two respective wafer surfaces are not flat, there will be an error introduced in the average value of the two measured values of $x_0$ that are used in the determination of the spacing of the two gratings. The difference in the height of the two surfaces of the wafer at the sites of the two gratings is measured by the use of a differential interferometric confocal and/or an interferometric non-confocal microscopy system preferentially operating in a dark field mode. The differential interferometric microscopy systems are such as described herein in the section entitled "Differential Interferometric Microscopy Systems." The differential interferometric microscopy systems may in addition be used to detect defects at either of the two sites.

To obtain a corrected value of the separation of the two gratings, the measured difference in height and the sensitivity function $\partial\Phi_2/\partial z_0$ given by Equation (21) are used to compute the correction that needs to be made to the average value of the two measured values of $x_0$ used in the determination of the spacing of the two gratings.

The results of the relative locations are used in an overlay and CD metrology systems which can further be used in APC. The results of CD measurements can be used in OPC.

Figure 1H:
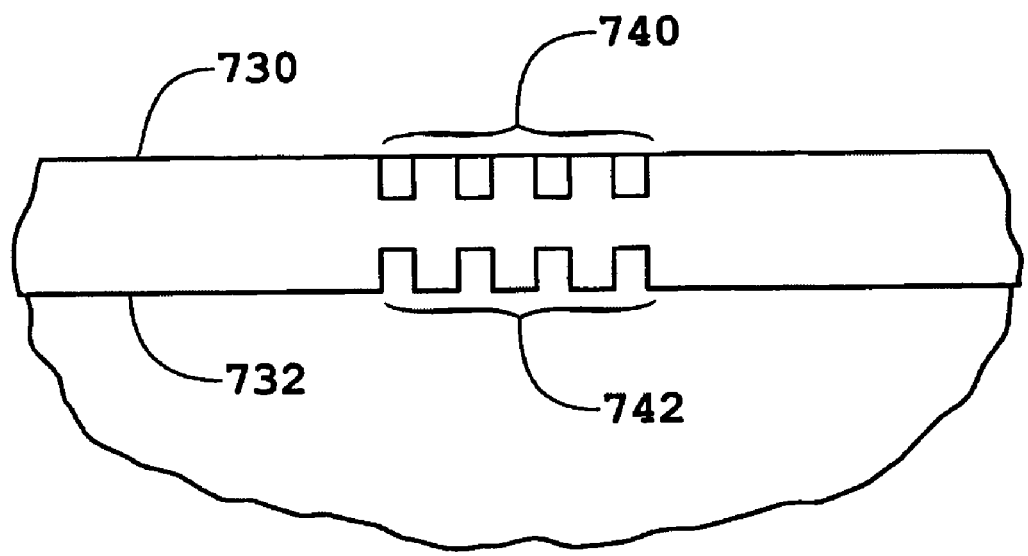
FIG. 1h is a diagram of gratings located on two different process layers of a wafer that are superimposed.

Relative Location of Superimposed Gratings Located on Two Different Process Layers of Wafer The relative location of superimposed gratings such as shown in FIG. 1h is determined by measurement of other properties of the conjugated quadratures, e.g., values of differential conjugated quadratures as a function of scattering angle of respective reflected/scattered beams and inverting the measured quantities to obtain information about the relative location of the superimposed gratings. With reference to FIG. 1h, the two superimposed gratings 740 and 742 are located in photoresist layer 730 and process layer 732, respectively. Gratings 740 and 742 are generated by exposure induced changes in the photoresist with or without post exposure treatment. The inversion procedure is based on a rigorous treatment of scattering and iterating the assumed properties of the superimposed gratings until the computed other properties of the conjugated quadratures matches the measured other properties of the conjugated quadratures to a requisite level.

The rigorous treatment of scattering includes the affects of fields of beams generated by one or more reflections/scatterings by each of two stacked gratings.

The results of the relative locations are used in an overlay metrology system which can further be used in APC. The results of CD measurements can be used in OPC.

Measurement of TIS and WIS

In the WIS metrology system, the relative locations of features generated by exposure induced changes in photoresist with or without post exposure treatment are measured using an embodiment of the present invention and comparing the results with the corresponding relative locations of the features either after the wafer is developed and etched or developed, etched, and processed by CMP for example, or compared with both of the corresponding relative locations.

In the TIS metrology system, the relative locations of features generated by exposure induced changes in photoresist with or without post exposure treatment are measured using an embodiment of the present invention and comparing the results with the corresponding relative locations of the features with an independent reference or standard. In comparing the TIS of one lithography tool with a second lithography tool, the relative locations of features generated by exposure induced changes in photoresist with or without post exposure treatment are measured in each of the two lithography tools using an embodiment of the present invention and comparing the results.

The results of the measurements of WIS and TIS can be used in an overlay and CD metrology systems, which can further be used in APC.

PO Optic Axis and PO Aberration Metrology Systems

The description of the PO optic axis and aberration metrology systems are given herein in sections entitled "Location Of Feature: Single Element Type," "Location Of A Feature: Grating Type," and "Relative Location Of Two Gratings Located On Same Photoresist Layer Of Wafer." The feature used in the PO optic axis and aberration metrology systems may be written in the scribe-lines of the wafer and the spatial properties of the feature designed optimally for location determination of PO optic axis and for aberration monitoring of PO.

The location of a PO optic axis and/or the aberrations of the PO can be measured within a short period of time, e.g., 0.1 seconds, after exposure of a respective site on a wafer and during the exposure cycle of the wafer. Effects of measured changes in PO optic axis can be compensated in real time during the exposure cycle of the tool by using the measured changes in PO optic axis in the servo system controlling the location of the wafer stage. Effects of measured changes in PO aberrations can be compensated in real time during the exposure cycle of the tool by using the measured changes in PO aberrations in a servo system controlling the imaging properties of the PO comprising either an optical, e-beam or ion-beam for writing to the respective wafer. The effect of in process measurement of the location of a PO optic axis and/or the aberrations of the PO on the throughput of a lithography tool can be designed to be <0.1% for a single or dual stage lithography tool exposing 120 wafers/hour.

Figure 7:
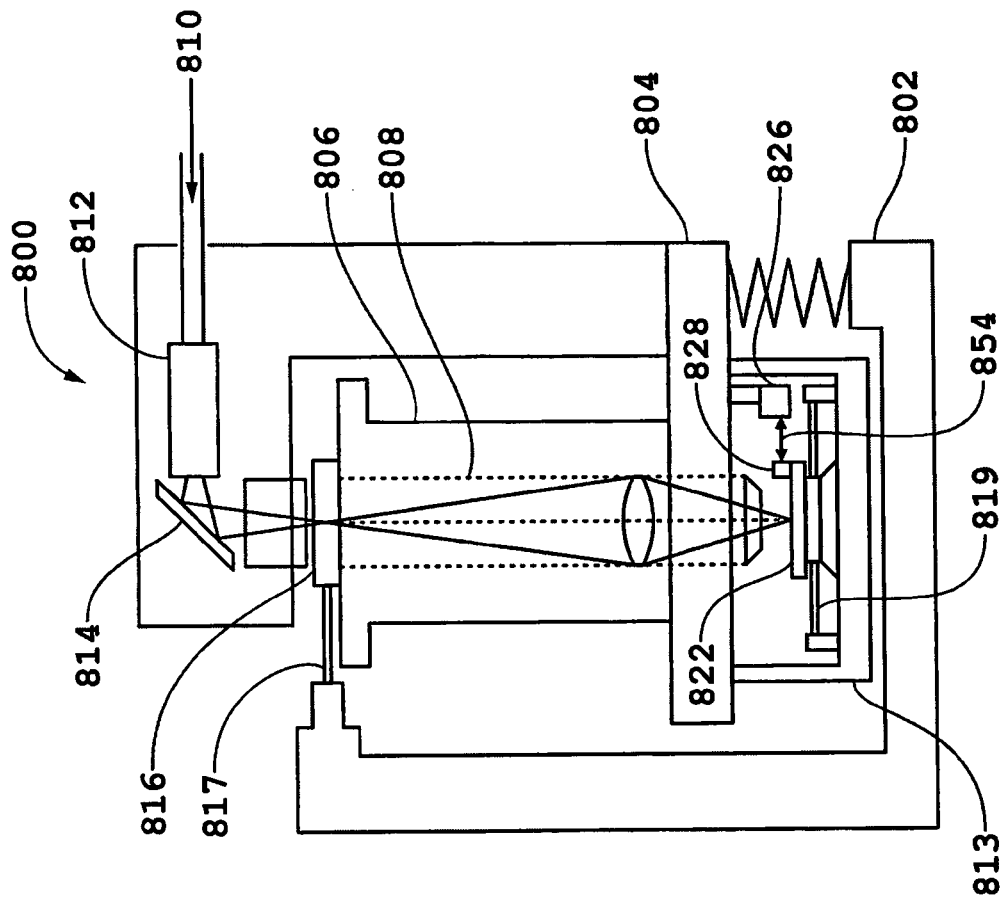
FIG. 7 is a diagram of lithography tool using a CD, overlay, PO optic axis and/or PO aberration metrology system.

An example of a lithography tool 800 using a CD, overlay, PO optic axis and/or PO aberration metrology system (not shown) is shown in FIG. 7. The metrology system is used to precisely measure a CD or overlay or precisely locate the PO optic axis and/or the PO aberrations within an exposure system. Here, stage 822 is used to position and support the wafer relative to an exposure station. Lithography tool 800 includes a frame 802, which carries other support structures and various components carried on those structures. An exposure base 804 has mounted on top of it a lens housing 806 atop of which is mounted a reticle or mask stage 816, which is used to support a reticle or mask. A positioning system for positioning the mask relative to the exposure station is indicated schematically by element 817. Positioning system 817 can include, e.g., piezoelectric transducer elements and corresponding control electronics. Although, it is not included in this described embodiment, one or more interferometry systems are used to precisely measure the position of the mask stage as well as other moveable elements whose position must be accurately monitored in processes for fabricating lithographic structures (see supra Sheats and Smith *Microlithography: Science and Technology*).

Suspended below exposure base 804 is a support base 813 that carries wafer stage 822. Stage 822 includes a plane mirror 828 for reflecting a measurement beam 854 directed to the stage by interferometry system 826. A positioning system for positioning stage 822 relative to interferometry system 826 is indicated schematically by element 819. Positioning system 819 can include, e.g., piezoelectric transducer elements and corresponding control electronics. The measurement beam reflects back to the interferometry system, which is mounted on exposure base 804.

During operation, a radiation beam 810, e.g., an ultraviolet (UV) beam from a UV laser (not shown), passes through a beam shaping optics assembly 812 and travels downward after reflecting from mirror 814. Thereafter, the radiation beam passes through a mask (not shown) carried by mask stage 816. The mask (not shown) is imaged onto a wafer (not shown) on wafer stage 822 via a PO 808 carried in a housing 806. Base 804 and the various components supported by it are isolated from environmental vibrations by a damping system depicted by spring 820.

There are, of course, many alternative known techniques and systems for exposing photoresist that has been applied to the surface of a substrate. Some of those systems project a patterned mask onto the photoresist, others use laser scanning to project the pattern onto the photoresist. Similarly, there are many different techniques and systems for applying the photoresist to the substrate. The ideas presented herein are not meant to be limited to any one of those techniques or systems but are intended to be widely applicable.

In the following description of the different embodiments, many elements of the different embodiments perform like functions and are indicated with the same numerals in different respective figures of the embodiments.

Referring to FIG. 1a, an interferometer system is shown diagrammatically comprising an interferometer 10, a source 18, a beam-conditioner 22, detector 70, an electronic processor and controller 80, and a measurement object 60. Source 18 is a pulsed or shuttered source that generates input beam 20 comprising one or more frequency components. Beam 20 is incident on and exits beam-conditioner 22 as input beam 24 that comprises a single polarized component or two orthogonally polarized components. Each of the polarized components comprises one or more different frequency components. The measurement beam components of the frequency components of input beam 24 are coextensive in space and have the same temporal window function and the corresponding reference beam components are coextensive in space and have the same temporal window function. The measurement beam components and the reference beam components may be coextensive in space or not coextensive in space.

Reference and measurement beams may be generated in either beam-conditioner 22 from a set of beams from source 18 or in interferometer 10 for each of the frequency components of input beam 24. Measurement beam 30A generated in either beam-conditioner 22 or in interferometer 10 is incident on measurement object 60. Measurement beam 30B is a return measurement beam generated as either a portion of measurement beam 30A reflected and/scattered or transmitted by measurement object 60. Return measurement beam 30B is combined with the reference beam in interferometer 10 to form output beam 34.

Output beam 34 is detected by detector 70 to generate one or more electrical interference signals per source pulse for the homodyne detection method used and transmitted as signal 72. Detector 70 may comprise an analyzer to select common polarization states of the reference and return measurement beam components of beam 34 to form a mixed beam. Alternatively, interferometer 10 may comprise an analyzer to select common polarization states of the reference and return measurement beam components such that beam 34 is a mixed beam.

In the practice, known phase shifts are introduced between the reference and measurement beam components of output beam 34 by two different techniques. In the first technique, phase shifts are introduced between corresponding reference and measurement beam components for each of the frequency components of output beam 34 as a consequence of a non-zero optical path difference between the reference and measurement beam paths in interferometer 10 and corresponding frequency shifts introduced to the frequency components of input beam 24 by beam-conditioner 22 and/or source 18 as controlled by signals 74 and 92, respectively, from electronic processor and controller 80. In the second technique, phase shifts are introduced between the reference and measurement beam components for each of the frequency components of input beam 24 by beam-conditioner 22 and/or source 18 as controlled by signals 74 and 92, respectively, from electronic processor and controller 80.

There are different ways to configure source 18 and beam-conditioner 22 to meet the input beam requirements of the different embodiments of the present invention. Examples of beam-conditioners that may be used in either first or the second technique comprise combinations of a two frequency generator and phase shifting type of beam-conditioner such as described in commonly owned U.S. Provisional Patent Application No. 60/442,858 (ZI-47) entitled "Apparatus and Method for Joint Measurements of Conjugated Quadratures of Fields of Reflected/Scattered Beams by an Object in Interferometry" and corresponding U.S. patent application Ser. No. 10/765,368 (ZI-47) entitled "Apparatus and Method for Joint Measurements of Conjugated Quadratures of Fields of Reflected/Scattered and Transmitted Beams by an Object in Interferometry" wherein both of the applications are by Henry A. Hill and the contents of which are incorporated herein in their entirety by reference.

Other examples of beam-conditioners that may be used in either the first or the second technique comprise combinations of multiple frequency generators and phase shifting types of beam-conditioners such as described for example in commonly owned U.S. Provisional Patent Application No. 60/459,425 (ZI-50) entitled "Apparatus and Method for Joint Measurement of Fields of Scattered/Reflected Orthogonally Polarized Beams by an Object in Interferometry," in corresponding U.S. patent application Ser. No. 10/816,180 (ZI-50) also entitled "Apparatus and Method for Joint Measurement of Fields of Scattered/Reflected Orthogonally Polarized Beams by an Object in Interferometry," and in commonly owned U.S. Provisional Application filed Aug. 16, 2004 (ZI-57) entitled "Apparatus and Method for Joint And Time Delayed Measurements of Components of Conjugated Quadratures of Fields of Reflected/Scattered and Transmitted/Scattered Beams by an Object in Interferometry." The three U.S. Provisional Patent Applications and the two U.S. patent applications are all by Henry A. Hill and the contents of which are incorporated herein in their entirety by reference.

With a continuation of the description of different ways to configure source 18 and beam-conditioner 22 to meet the input beam requirements of different embodiments of the present invention, source 18 will preferably comprise a pulsed source. There are a number of different ways for producing a pulsed source such as described in cited U.S. Provisional Application filed Aug. 16, 2004 (ZI-57) entitled "Apparatus and Method for Joint And Time Delayed Measurements of Components of Conjugated Quadratures of Fields of Reflected/Scattered and Transmitted/Scattered Beams by an Object in Interferometry."

The output beams from source 18 comprising two or more frequency components may be combined in beam-conditioner 22 by beam-splitters to form coextensive measurement and reference beams that are either spatially separated or coextensive as required in various embodiments of the present invention. The frequency shifting of the various components required in certain embodiments of the present invention may be introduced in source 18 for example by frequency modulation of input beams to parametric generators and the phase shifting of reference beams relative to measurement beams in beam-conditioner 22 may be achieved by phase shifters of the optical-mechanical type comprising for example prisms or mirrors and piezoelectric translators or of the electro-optical modulator type such as described in cited U.S. Provisional Patent Application No. 60/573,196 (ZI-62) and in cited U.S. Provisional Patent Application filed Aug. 16, 2004 (ZI-57).

The general description is continued with reference to FIG. 1a. Input beam 24 is incident on interferometer 10 wherein reference beams and measurement beams are generated. The reference beams and measurement beams comprise one or two arrays of reference beams and one or two arrays of measurement beams, respectively, for measurements using measurement beams that comprise a single polarization state or two orthogonal polarization states, respectively, wherein the arrays may comprise arrays of one element. The arrays of measurement beams are focused on and/or in measurement object 60 and arrays of return measurement beams are generated by reflection/scattering by measurement object 60. The arrays of reference beams and return measurement beams are combined by a beam-splitter to form one or two arrays of output beams using measurement beams that comprise a single polarization state or two orthogonal polarization states, respectively. The arrays of output beams are mixed with respect to state of polarization either in interferometer 10 or in detector 70. The arrays of output beams are subsequently focused to spots on pixels of a multipixel detector and detected to generate the array of electrical interference signals 72.

The conjugated quadratures of fields of return measurement beams are obtained by using a single or double or a homodyne detection method or bi- or quad-homodyne detection method or variants and extensions thereof. The bi- and quad-homodyne detection methods are described for example in cited U.S. Provisional Patent Application No. 60/442,858 (ZI-47) and U.S. patent application Ser. No. 10/765,368 (ZI-47). The variants and extensions of the bi- and quad-homodyne detection methods are described for example in cited U.S. Provisional Patent Application No. 60/459,425 (ZI-50), U.S. patent application Ser. No. 10/816,180 (ZI-50), and U.S. Provisional Patent Application filed Aug. 16, 2004 (ZI-57) entitled "Apparatus and Method for Joint And Time Delayed Measurements of Components of Conjugated Quadratures of Fields of Reflected/Scattered and Transmitted/Scattered Beams by an Object in Interferometry."

For the single-homodyne detection method, input beam 24 comprises a single frequency component and sets of four or eight measurements of the array of electrical interference signals 72 is made in non-ellipsometric or ellipsometric measurements, respectively. For each of the measurements of the array of electrical interference signals 72 in non-ellipsometric and ellipsometric measurements, known phase shifts are introduced between each reference beam component and respective return measurement beam component of output beam 34. The subsequent data processing procedure used to extract the conjugated quadratures of fields of beams reflected and/or scattered by a substrate is described for example in commonly owned U.S. Pat. No. 6,445,453 (ZI-14) entitled "Scanning Interferometric Near-Field Confocal Microscopy" by Henry A. Hill, the contents of which are incorporated herein in their entirety by reference.

The double-homodyne detection method which is applicable to non-ellipsometric measurements uses input beam 24 comprising four frequency components and four detectors to obtain measurements of electrical interference signals that are subsequently used to obtain conjugated quadratures in non-ellipsometric measurements. Each detector element of the four detector elements obtains a different one of the four electrical interference signal values with the four electrical interference signal values obtained simultaneously to compute the conjugated quadratures for a field. Each of the four electrical interference signal values contains only information relevant to one orthogonal component of the conjugated quadratures. The double-homodyne detection used herein is related to the detection methods such as described in Section IV of the article by G. M D'ariano and M G. A. Paris entitled "Lower Bounds On Phase Sensitivity In Ideal And Feasible Measurements," *Phys. Rev. A* 49, 3022-3036 (1994). Accordingly, the double-homodyne detection method does not make joint determinations of conjugated quadratures of fields wherein each electrical interference signal value contains information simultaneously about each of two orthogonal components of the conjugated quadratures.

In the adaptation of the double-homodyne detection method to ellipsometric measurements, input beam 24 comprises eight frequency components and eight detectors to obtain measurements of eight electrical interference signals that are subsequently used to obtain conjugated quadratures. Each detector element of the eight detector elements obtains a different one of the eight electrical interference signal values with the eight electrical interference signal values obtained simultaneously to compute the conjugated quadratures of fields of scattered/reflected orthogonally polarized fields. Each of the eight electrical interference signal values contains only information relevant to one orthogonal component of one of the two conjugated quadratures.

The bi- and quad-homodyne detection methods obtain measurements of electrical interference signals wherein each measured value of an electrical interference signal contains simultaneously information about two orthogonal components of conjugated quadratures. The two orthogonal components correspond to orthogonal components of conjugated quadratures such as described in cited U.S. Provisional Patent Application No. 60/442,858 (ZI-47) and U.S. patent application Ser. No. 10/765,368 (ZI-47).

The variants of the bi- and quad-homodyne detection methods obtain measurements of electrical interference signals wherein each measured value of an electrical interference signal contains simultaneously information about two orthogonal components of each of two conjugated quadratures of fields of scattered/reflected orthogonally polarized beams. The two orthogonal components of the two conjugated quadratures correspond to orthogonal components of conjugated quadratures such as described in cited U.S. Provisional Patent Application No. 60/459,425 (ZI-50) and cited corresponding U.S. patent application Ser. No. 10/816, 180 (ZI-50) and entitled "Apparatus and Method for Joint Measurement of Fields of Scattered/Reflected Orthogonally Polarized Beams by an Object in Interferometry".

The extensions of the bi- and quad-homodyne detection methods to N-dimensional bi- and quad-homodyne detection methods obtain simultaneous joint measurements N independent conjugated quadratures of fields such as described in cited U.S. Provisional Patent Application filed Aug. 16, 2004 (ZI-57) entitled "Apparatus and Method for Joint And Time Delayed Measurements of Components of Conjugated Quadratures of Fields of Reflected/Scattered and Transmitted/Scattered Beams by an Object in Interferometry."

A first embodiment of the present invention is shown schematically in FIG. 1b. The first embodiment comprises a first imaging system generally indicated as numeral 100, pinhole array beam-splitter 12, detector 70, and a second imaging system generally indicated as numeral 110. The second imaging system 110 is low power microscope having a large working distance, e.g. Nikon ELWD and SLWD objectives and Olympus LWD, ULWD, and ELWD objectives.

The first imaging system 100 is shown schematically in FIG. 1c. Imaging system 100 is a catadioptric system such as described in commonly owned U.S. Pat. No. 6,552,852 B2 (ZI-38) and U.S. Pat. No. 6,717,736 (ZI-43) both of which are entitled "Catoptric and Catadioptric Imaging System" wherein both applications are to Henry A. Hill, the contents of the two cited patents incorporated herein in their entirety by reference.

The description of interferometer 100, a source 18, beam-conditioner 22, detector 70, and electronic processor and controller 80 is the same as corresponding portions of the descriptions of catoptric and catadioptric imaging systems given in U.S. Patent Provisional Patent Application No. 60/485,507 (ZI-52) entitled "Apparatus and Method for High Speed Scan for Subwavelength Defects in Semiconductor Metrology" and U.S. patent application filed Jul. 7, 2004 (ZI-52) entitled "Apparatus and Method for High Speed Scan for Subwavelength Defects in Semiconductor Metrology" wherein both are by Henry A. Hill and the contents of which are incorporated herein in their entirety by reference.

A number of different catadioptric imaging systems for far-field and near-field interferometric confocal microscopy have been described such as in cited U.S. Pat. No. 6,552,852 (ZI-38) and cited U.S. Pat. No. 6,717,736 (ZI-43); in commonly owned U.S. Provisional Patent Application Nos. 60/447,254 (ZI-40) entitled "Transverse Differential Interferometric Confocal Microscopy," 60/448,360 (ZI-41) entitled "Longitudinal Differential Interferometric Confocal Microscopy," 60/448,250 (ZI-42) entitled "Thin Film Metrology Using Interferometric Confocal Microscopy," 60/442,982 (ZI-45) entitled "Interferometric Confocal Microscopy Incorporating Pinhole Array Beam-Splitter," 60/459,425 (ZI-50) entitled "Apparatus and Method for Joint Measurement Of Fields Of Orthogonally Polarized Beams Scattered/Reflected By An Object In Interferometry," 60/485,255 (ZI-53) entitled "Apparatus and Method for Ellipsometric Measurements with High Spatial Resolution," 60/501,666 (ZI-54) entitled "Catoptric and Catadioptric Imaging Systems With Adaptive Catoptric Surfaces," and 60/506,715 (ZI-56) entitled "Catoptric and Catadioptric Imaging Systems Comprising Pellicle Beam-Splitters And Non-Adaptive And Adaptive Catoptric Surfaces;" and U.S. patent applications Ser. No. 10/778,371 (ZI-40) entitled "Transverse Differential Interferometric Confocal Microscopy," Ser. No. 10/782,057 (ZI-41) entitled "Longitudinal Differential Interferometric Confocal Microscopy," Ser. No. 10/782,058 (ZI-42) entitled "Thin Film Metrology Using Interferometric Confocal Microscopy," Ser. No. 10/765,229 (ZI-45) entitled "Interferometric Confocal Microscopy Incorporating Pinhole Array Beam-Splitter," and Ser. No. 10/816,180 (ZI-50) entitled "Apparatus and Method for Joint Measurement Of Fields Of Orthogonally Polarized Beams Scattered/Reflected By An Object In Interferometry." The eight provisional patent applications, and the corresponding five non-provisional patent applications are all by Henry A. Hill and the contents of each of which are incorporated herein in their entirety by reference. Other forms of non-catoptric or non-catadioptric microscopy imaging systems may be used for interferometer 100 without departing from the spirit or scope of the present invention.

With reference to FIG. 1b, a first portion of input beam 24 is transmitted by polarizing beam-splitter 54A and reflected by mirror 54D as measurement beam 24A. A second portion of beam 24 is reflected by beam-splitter 54A as reference beam 24B after reflection by mirrors 54B and 54C. Measurement beam 24A is incident on an array of slits 114 and a portion thereof transmitted as an array of diffracted measurement beams as shown in FIG. 1e. A diagram of slit array 114 is shown in FIG. 1f where the width of the slits is c and the pitch of the slit array is d. The array of measurement beams is incident on non-polarizing beam-splitter 116 and a portion thereof transmitted as an array of measurement beams forming the measurement beam component of beam 26A. Reference beam 24B is incident on non-polarizing beam-splitter 116 and a portion thereof reflected as the reference beam component of the beam incident on pinhole array beam-splitter 112 (see FIG. 1d). The optical elements in FIG. 1e correspond to the optical elements in FIG. 1c.

The angle of incidence of the reference beam component incident on pinhole array beam-splitter 112 is selected to meet the condition specified cited with respect to the very general property cited following Equation (15) herein. The very general property has to do with the absence of an x dependence in the interference cross-term between the reference beam and the reflected/scattered measurement beam from a given Porro type prism in the electrical interference values.

The direction of the slits in slit array 114 is parallel to the direction orthogonal to FIGS. 1c and 1d and parallel to the η direction (see FIG. 5 and related discussion). The width of the slits c is selected such that the affect of diffraction on the transmitted portion of measurement beam 24A is to generate for each beam of the array of diffracted measurement beams a beam divergence in the q direction that covers the desired range in η, i.e., $\eta_1 \leq \eta \leq \eta_2$ (see discussion related to FIG. 5). The location of slit array 114 is the conjugate position of pinhole array 112 as generated by beam-splitter 116. Thus the slit array 114 and pinhole array 112 are imaged in the same plane in the space of measurement object 60.

Figure 2A:
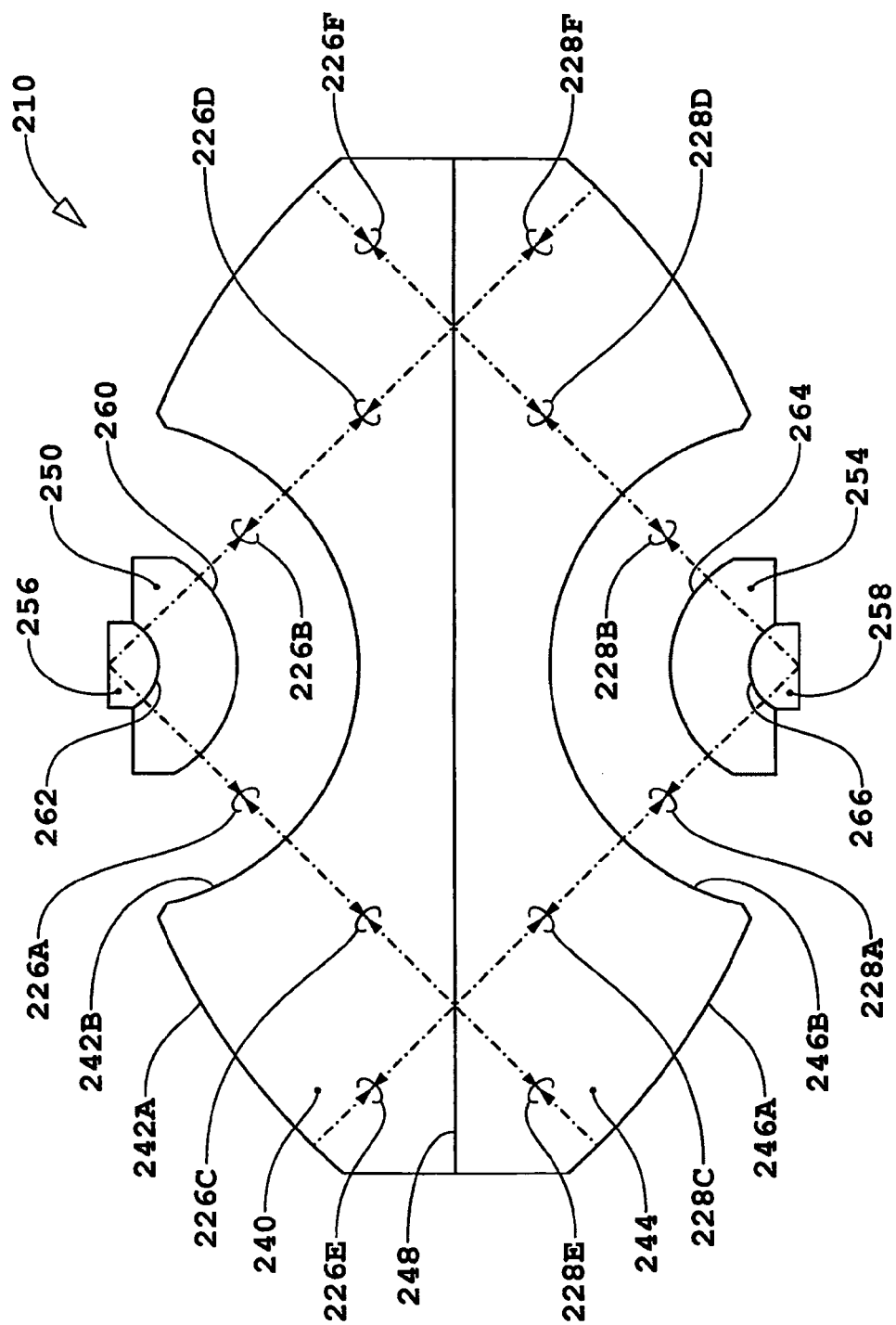
FIG. 2a is a schematic diagram of an achromatic astigmatic catadioptric imaging system.
Figure 2B:
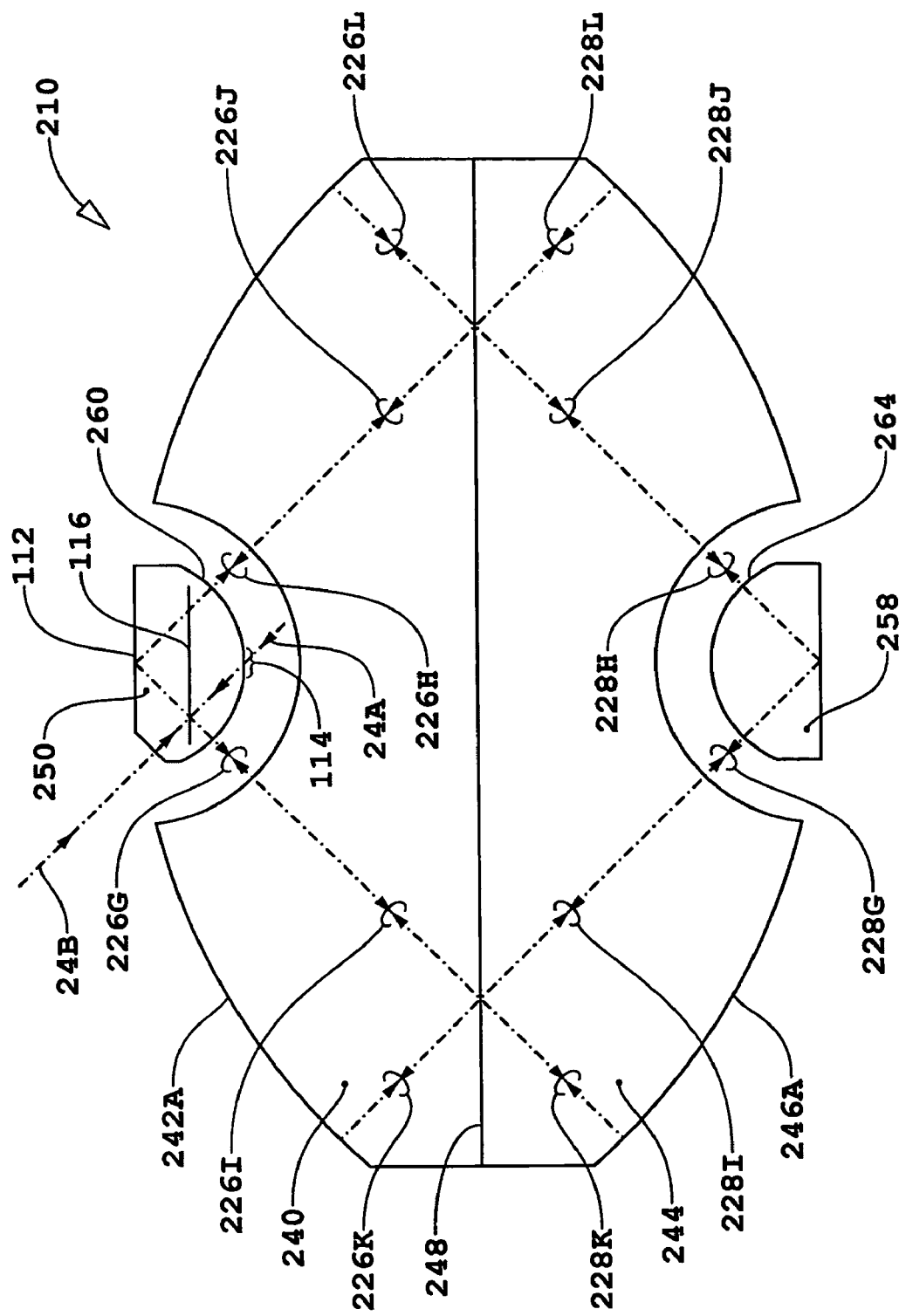
FIG. 2b is a diagram an astigmatic catadioptric imaging system and a beam-splitter system for introducing measurement and reference beams into an interferometric metrology system.

The use of slit array 114 and non-polarizing beam-splitter 116 are also shown in FIG. 2b.

Catadioptric imaging system 100 comprises a section of catadioptric imaging system 200 shown schematically in FIG. 2a that corresponds to the section shown in FIG. 1c. Elements of catadioptric imaging system 200 shown in FIG. 2a comprise two different media in order to generate an achromatic anastigmat such as described in cited U.S. Provisional Application No. 60/485,507 (ZI-52) and U.S. patent application filed Jul. 7, 2004 (ZI-52) and entitled "Apparatus and Method for High Speed Scan for Subwavelength Defects in Semiconductor Metrology."

A variant of catadioptric imaging system 200 is shown in FIG. 2b wherein catadioptric imaging system 110 is an anastigmat that is not achromatic such as described in cited U.S. Provisional Application No. 60/485,507 (ZI-52) and U.S. patent application filed Jul. 7, 2004 (ZI-52) and entitled "Apparatus and Method for High Speed Scan for Subwavelength Defects in Semiconductor Metrology."

Also shown in FIG. 2b is measurement beam 24A and reference beam 24B, slit array 114, and beam-splitter 116. The description of the generation of measurement beam 24A and reference beam 24B and the description of slit array 114 and beam-splitter 116 are the same as the description given for the same element numbers shown in FIG. 1e.

Another form of catadioptric imaging system that may be used for catadioptric and catoptric imaging system 100 is the catadioptric imaging system such as described in cited U.S. Provisional Patent Application No. 60/460,129 (ZI-51) and U.S. patent application Ser. No. 10/816,172 (ZI-51).

Figure 2C:
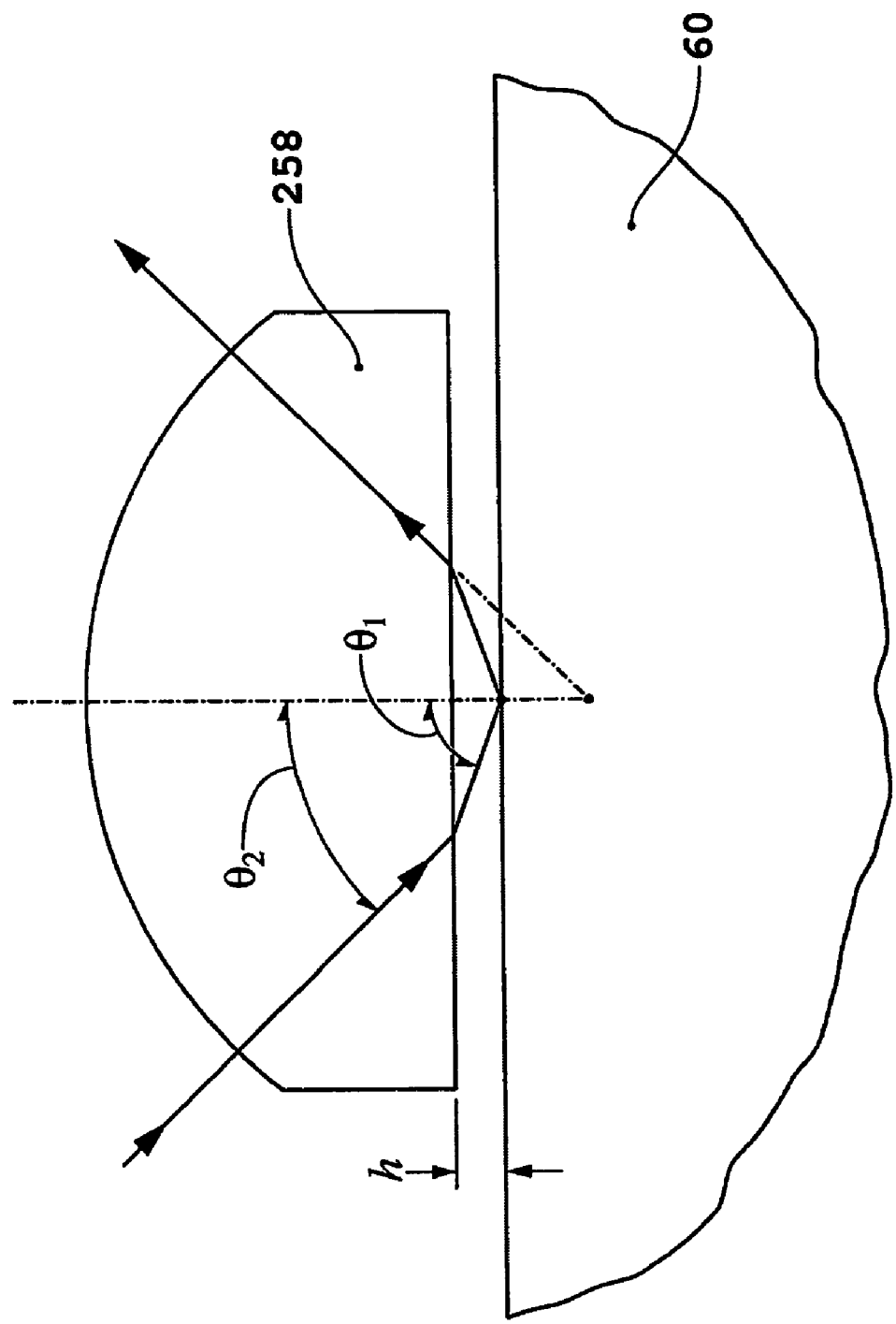
FIG. 2c is a schematic diagram of a section of a catadioptric imaging system located near a measurement object.
Figure 2D:
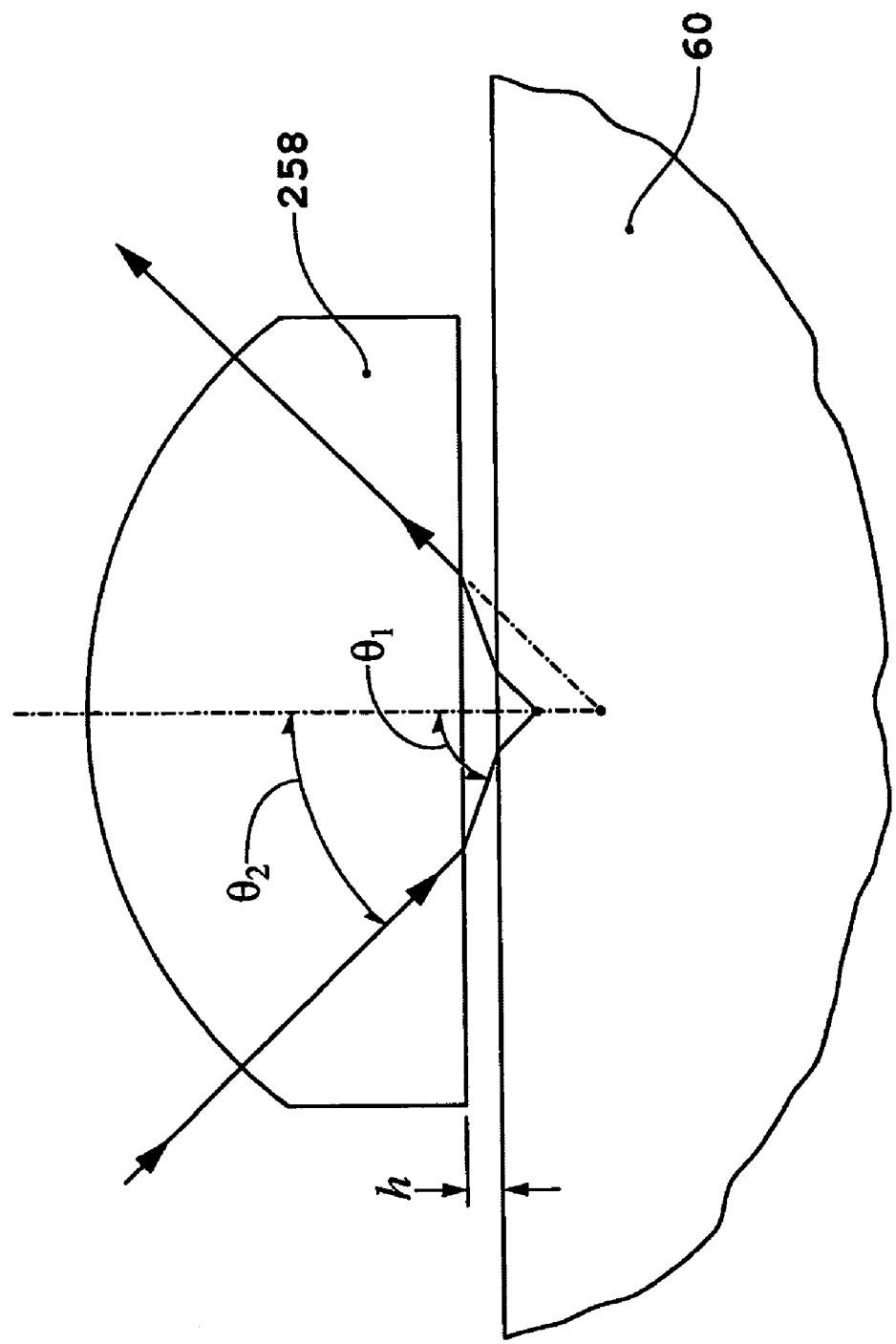
FIG. 2d is a schematic diagram of a section of a catadioptric imaging system located near a measurement object and imaging an interior section of the measurement object.

The location of the object plane of catadioptric imaging system 200 is outside of plano convex lens 158 and on the surface of substrate 60 which is shown diagrammatically in FIG. 2c. The separation of the plane surface of plano convex lens 158 and the surface of substrate 60 is h. The object plane of catadioptric imaging system 200 may also be located in the interior of substrate 60 which is shown diagrammatically in FIG. 2d.

An advantage of the catadioptric imaging system 200 is that as a consequence of the spherical aberration introduced by transmission through plane surfaces, the effective angle of incidence $\theta_1$ can be scanned by introducing a scan in h.

For those end use applications where compensation is required for the spherical aberration introduced by transmission through plane surfaces, procedures may be use such as described in cited U.S. Provisional Patent Application No. 60/444,707 (ZI-44) and U.S. patent application Ser. No. 10/771,785 (ZI-44).

The description of imaging system 100 is continued with reference to FIG. 1c. Lens sections 40 and 44 are pie sections of lens 240 and 244 shown in FIG. 2a. Lens elements 250, 256, 254, and 258 in FIG. 1c are the same elements lens elements 250, 256, 254, and 258 in FIG. 2a. Convex lens 52 has a center of curvature the same as the center of curvature of convex lens 250. Convex lenses 250 and 52 are bonded together with pinhole beam-splitter 12 in between. Pinhole array beam-splitter 12 is shown in FIG. 1c. The pattern of pinholes in pinhole array beam-splitter is chosen so that the image of pinhole beam-splitter 12 on detector 70 to match the pixel pattern of detector 70. An example of a pattern is a two dimensional array of equally spaced pinholes in two orthogonal directions. The pinholes may comprise circular apertures, rectangular apertures, or combinations thereof such as described in commonly owned U.S. patent application Ser. No. 09/917,402 (ZI-15) entitled "Multiple-Source Arrays for Confocal and Near-field Microscopy" by Henry A. Hill and Kyle Ferrio of which the contents thereof are incorporated herein in their entirety by reference. The pinholes may also comprise microgratings such as described in cited U.S. Provisional Patent Application No. 60/459,425. A non-limiting example of a pinhole array for pinhole array beam-splitter 12 is shown in FIG. 1d having a spacing between pinholes of b with aperture size a.

A second embodiment of the present invention is described for the joint measurement of the conjugated quadratures of fields of complimentary measurement beams reflected/scattered by features of a measurement object. The complimentary measurement beams correspond to two measurement beams that have angles or average angles of incidence that are equal in magnitude but opposite in sign. The information obtained for each of the two measurement beams is the same as the information obtained respectively by using the first embodiment of the present invention with the measurement object in a non-rotated and in a rotated orientation. The rotation axis for changing the orientation of the measurement object is parallel to the optic axis of the interferometric metrology system shown in FIG. 1b. The difference between the second embodiment and the use of the first embodiment with the measurement object in a non-rotated and in a rotated orientation is that the information obtained for the two different orientations of the measurement object is obtained sequentially in the latter case and is obtained jointly in the case of the second embodiment. The difference may also be stated in terms of values of $\theta_I$ and $\theta_D$ for the two different measured quantities.

The second embodiment comprises the apparatus of embodiments described in cited U.S. Provisional Patent Application No. 60/460,129 (ZI-51) and U.S. patent application Ser. No. 10/816,172 (ZI-51) with certain modifications. The certain modifications have to do with the introduction of the measurement and reference beams to the interferometry metrology system of the second embodiment and the use of a phase-shifter 46C shown in FIG. 1d of cited U.S. Provisional Patent Application No. 60/460,129 (ZI-51) and U.S. patent application Ser. No. 10/816,172 (ZI-51). The description of the use of phase-shifter 46C to separate the forward and backscattered components of measurement beams is the same as the corresponding portions of descriptions given in cited U.S. Provisional Patent Application No. 60/460,129 (ZI-51) and U.S. patent application Ser. No. 10/816,172 (ZI-51).

The modification of the introduction of the measurement beam corresponds to the introduction of two complimentary measurement beams comprising two measurement beams that have angles or average angles of incidence that are equal in magnitude but opposite in sign at beam-splitter 114 shown in FIGS. 1f and 2b and overlap at beam-splitter 114. The modification of the introduction of the reference beam corresponds to the introduction of two complimentary reference beams comprising two reference beams that have angles or average angles of incidence that are equal in magnitude but opposite in sign at beam-splitter 116 shown in FIGS. 1f and 2b and overlap at pinhole array beam-splitter 12.

The remaining description of the second embodiment is the same as corresponding portions of the description given for the first embodiment herein.

A variant of the second embodiment is configured to obtain the information of the second embodiment in a non-joint manner. The variant of the second embodiment comprises the apparatus of the second embodiment with a set of shutters without phase-shifter 46C. The set of shutters are configured to shutter the input measurement and reference beams and the forward scattered measurement beams. The variant of the second embodiment corresponds to using the first embodiment of the present invention with the measurement object in a non-rotated and in a rotated orientation.

A third embodiment of the present invention is described for the joint measurement of the conjugated quadratures of fields of complimentary measurement beams reflected/scattered by Porro type prisms of features and other features of a measurement object. The complimentary measurement beams correspond to two measurement beams that have orthogonal states of linear polarization. The third embodiment comprises the apparatus of embodiments described in cited U.S. Provisional Patent Application No. 60/459,425 (ZI-50) and U.S. patent application Ser. No. 10/816,180 (ZI-50) and the apparatus and procedures of the first embodiment described herein.

For each of the first, second, and third embodiments of the present invention and variant thereof, the interferometric metrology systems may be configured in other embodiments to obtain information in the form of joint and non-joint measurements of the angular distribution of the differential conjugated quadratures of reflected/scattered beams from Porro type prisms in features and other features of measurement objects. The other embodiments comprise the apparatus described in cited U.S. Provisional Patent Application No. 60/501,666 (ZI-54) entitled "Catoptric and Catadioptric Imaging Systems With Adaptive Catoptric Surfaces" for the acquisition of information about angular distributions.

It will be apparent to those skilled in the art that there are other embodiments of the present invention comprising apparatus of the described embodiments of the present invention that within the same instrument, the required measurements and analyses for overlay, CD, and OP metrology systems can be achieved without departing from the spirit and scope of the present invention.

Embodiments of the present invention can be extended to operate not only into the VUV but also into the EUV. This is achieved by the use of pellicle type beam-splitters such as described in cited U.S. Provisional Patent Application No. 60/506,715 (ZI-56) and self supporting beam-splitters such as described by T. Haga, M. C. K. Tinone, M. Shimada. T. Ohkubo, and A. Ozawa in a article entitled "Soft x-ray multilayer beam splitters," *J. Synchrotron Rad.*, 5, pp 690 (1998). The description of techniques used in source 18 and beam-conditioner 22 for the generation of UV and VUV measurement and reference beams also can be used to generate EUV measurement and reference beams such as described in cited U.S. Provisional Application filed Aug. 16, 2004 (ZI-57) entitled U.S. Provisional Patent Application filed Aug. 16, 2004 (ZI-57) entitled "Apparatus and Method for Joint And Time Delayed Measurements of Components of Conjugated Quadratures of Fields of Reflected/Scattered and Transmitted/Scattered Beams by an Object in Interferometry."

For the extension of operation of the embodiments of the present invention into the EUV, a beam combining beam-splitter in a respective interferometric imaging system with a beam combining thin fluorescent layer or interface may be beneficially used such as described in cited U.S. Provisional Patent Application No. 60/506,715 (ZI-56). The use of a fluorescent layer impacts on the performance specifications required of optical elements and/or detector that follow the beam combining function to achieve a certain end use performance. The thin fluorescent layer, e.g., lumogen, absorbs light at one wavelength, e.g., the UV, VUV, or EUV and emits light at a longer wave length, e.g., in the visible. Thus there is a concomitant reduction in the required performance specifications of the subsequent optical elements because the subsequent optical elements serve only to transmit beams and generate optical images at the longer wavelength instead of at the shorter wavelength beam.

Differential Interferometric Microscopy Systems

The differential interferometric microscopy systems of the confocal and non-confocal type are used in embodiments of the present invention. The embodiment of the present invention that comprises a differential interferometric confocal microscopy system is the same as the differential interferometric confocal microscopy system described in cited U.S. Provisional Patent Application No. 60/459,425 (ZI-50) and U.S. patent application Ser. No. 10/816,180 (ZI-50). The differential interferometric confocal microscopy system is configured to operate in a dark field mode preferably and compares interferometrically the properties of two transversely separated sections of a substrate. If the properties of the two transversely separated sections are identical as the mask, patterned wafer, or unpatterned wafer is scanned, there will be no change in the measured conjugated quadratures. However, if at a certain location on the mask or patterned wafer, there is a difference in the two interferometrically compared sections, there will be a change in the measured conjugated quadratures.

The difference in properties may be in the form of a surface profile, widths of two sections, depths of the two sections, or a particle located on the surface or in one of the two sections. A difference in the two widths will generate a difference in the amplitudes of the beams scattered by the entrance plane aperture formed by the feature sections. A difference in the depths of the two sections or the presence of a particle located in one of the two sections will modify the properties of leaky and non-leaky guided wave modes that are excited in the features by the respective measurement beams. The description of the excited leaky guided wave modes and the fields radiated by the excited leaky guided wave modes is the same as described in commonly owned U.S. Provisional Patent No. 60/443,980 (ZI-46) entitled "Leaky Guided Wave Modes Used in Interferometric Confocal Microscopy to Measure Properties of Trenches" and U.S. patent application Ser. No. 10/765,254 (ZI-46) with the same title and both by Henry A. Hill. The contents of both the patent application and the provisional patent application are here within incorporated in their entirety by reference.

The sensitivity of the change in measured conjugated quadratures to changes in CDs and to depths are measured using independent measurements of the CDs or a simplified inversion analysis. The inversion analysis is simplified as a consequence of the primary measurements being differential. Detailed knowledge of the reflecting properties of two sections that are being compared interferometrically is required when the composition of the two sections are materially different. Because of the high level of modal structure of masks and patterned wafers, a detailed knowledge of the mask and patterned wafer structure is not required in the location of errors in CDs.

Figure 3:
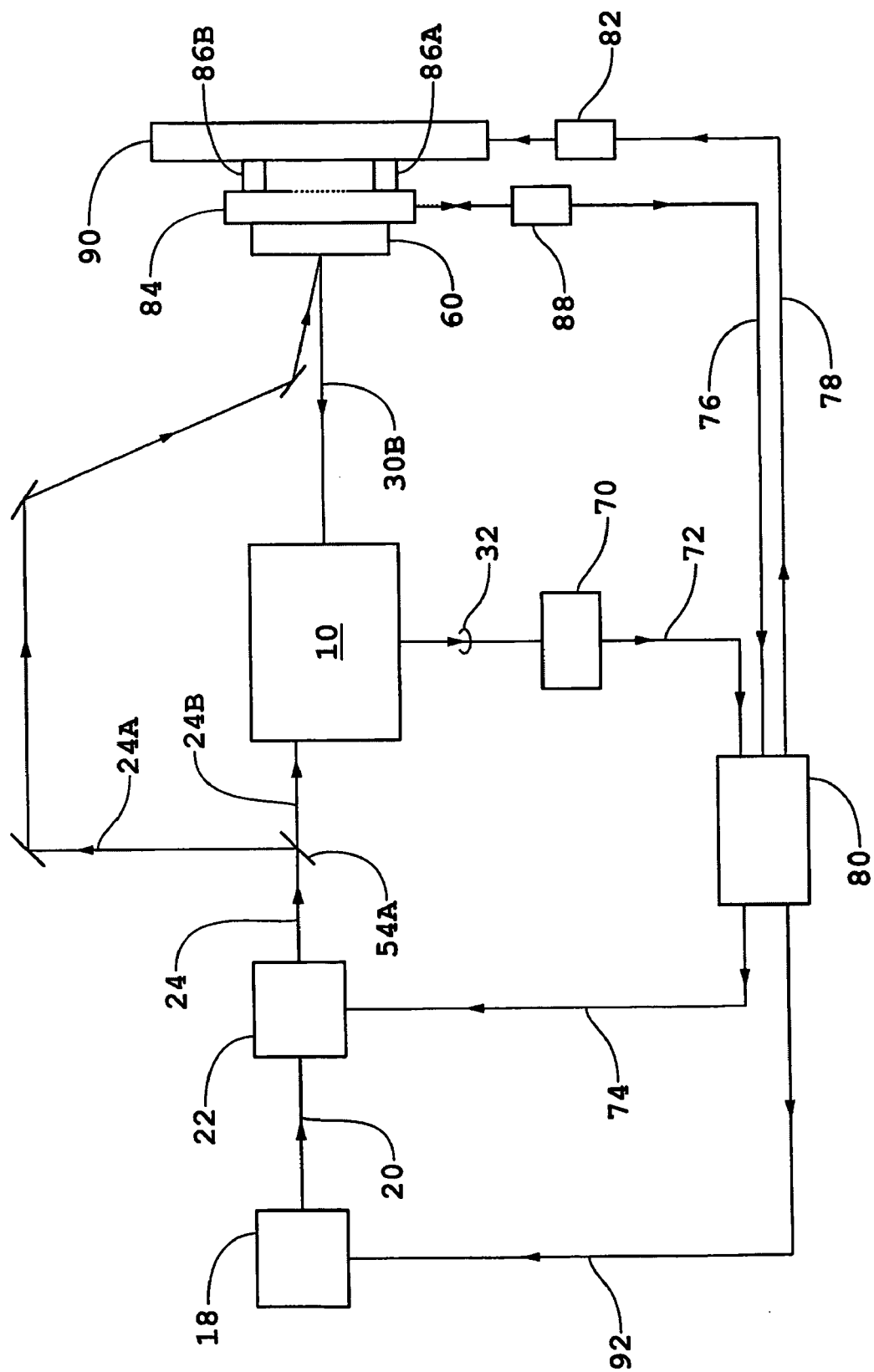
FIG. 3 is a diagram of an interferometric non-confocal microscopy system.

A differential interferometric non-confocal is shown generally in FIG. 3. The description of FIG. 3 is the same as the description given for FIG. 1a except with respect to measurement beam 24A. In FIG. 3, measurement beam 24A is incident on measurement object 60 with an angle of incidence that is nominally zero. The primary difference between the information obtained about the open or filled transparent features using the confocal and non-confocal interferometric microscopy systems is with respect to the properties of the leaky guided wave modes that are excited.

Information is obtained about the surface profile or the horizontal surface of an open or filled transparent feature or features with a reduced lateral spatial resolution and a reduced depth discrimination of the incident measurement beam for the non-confocal interferometric microscopy system. However, there is an advantage with the non-confocal interferometric microscopy system in that the amplitudes of the excited guided wave modes will generally be larger for the non-confocal interferometric microscopy system as compared to the corresponding confocal system. Another advantage for the non-confocal interferometric microscopy system is that the orders of the excited guided wave modes will generally comprise a smaller set as compared to the corresponding confocal system.

Thus the information obtained about errors in surface profiles, overlays, CDs, PO optical axis, PO aberrations, and the presence of defects in the form of particles from the confocal and the non-confocal interferometric microscopy systems are complimentary and will impact on the selection of one or the other of the confocal or non-confocal systems in an end use application.

In another embodiment of the present invention, the confocal and non-confocal interferometric microscopy systems are combined in a single interferometric microscopy system. The another embodiment comprises the apparatus of the confocal interferometric microscopy system and a beam delivery system for the measurement beam that switches the measurement beam 24A between a slit array beam-splitter 114 (see FIGS. 1f and 2b) and to object 60 with a nominal zero angle of incidence.

Many of the embodiments of the present invention can be configured for operation in the transmission mode consistent with properties of the mask or wafer for which overlay, CD, and/or PO information is required. The description of these embodiments is the same as the descriptions of interferometric metrology systems as described for example in cited U.S. Provisional Patent Application No. 60/506,715 (ZI-56).

Interferometric Microscopy Systems: Near- And Evanescent-Field Probe Beams

Other embodiments of the present invention may be configured to operate with measurement beams that have the properties of a near-field or an evanescent field at the wafer such as described in cited U.S. Pat. No. 6,445,453 (ZI-14) and U.S. Provisional Patent Application No. No. 60/506,715 (ZI-56), respectively. The information obtained with the other embodiments of the present invention has for example the high sensitivities of an interferometric metrology system to vertical displacements of a surface and to asymmetries at a site on a wafer. The high sensitivities of interferometric metrology systems based on use of near- or evanescent-field measurement beams lead to high accuracies in overlay, CD, and PO metrology systems and defect detection. The complexity of inversion procedures used in the overlay, CD, and PO metrology systems based on a rigorous treatment of scattering is generally reduced because the patterns on the wafer under measurement need not be overlapping in order to obtain the desired information with required accuracy.

Figure 8:
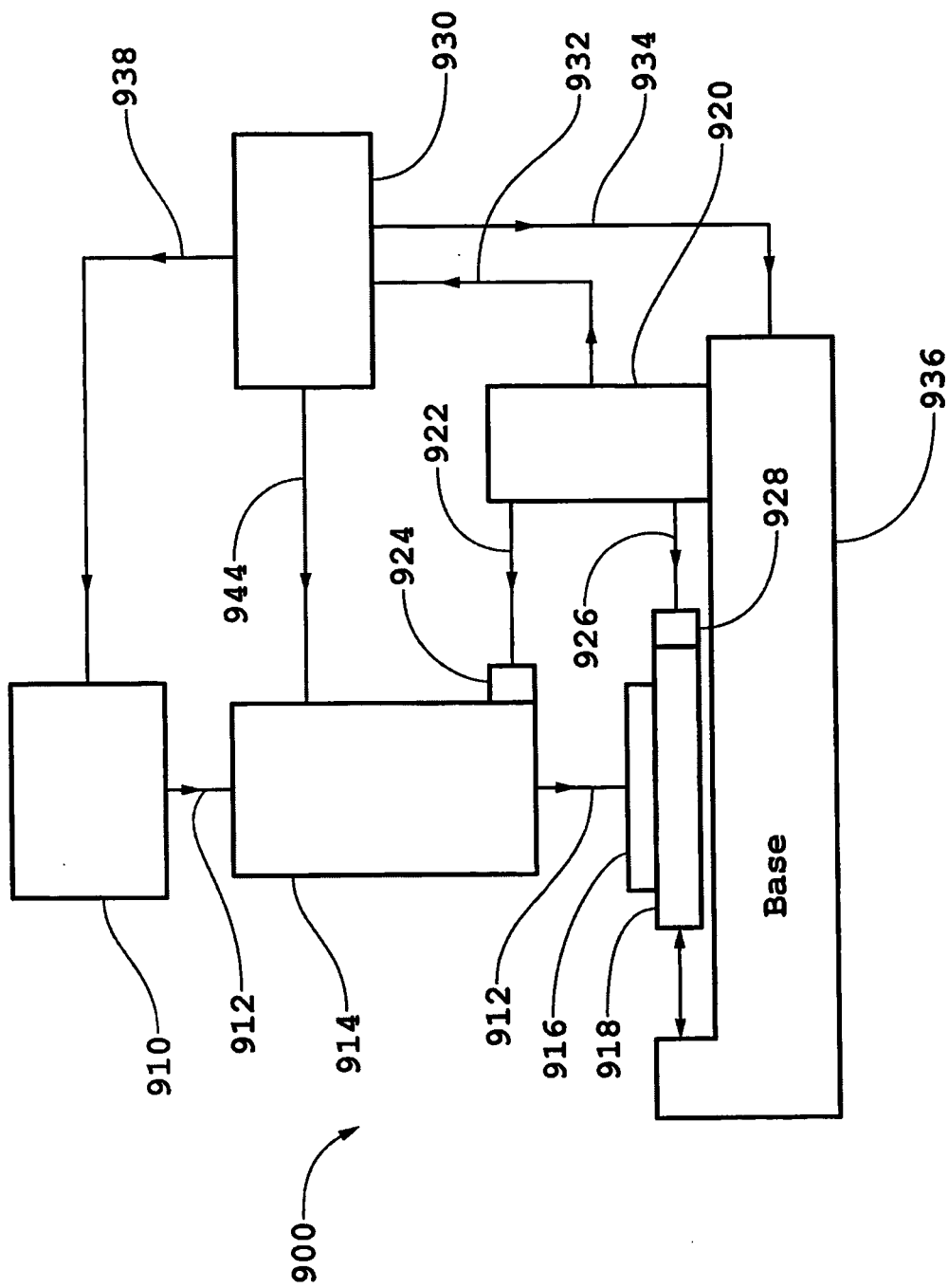
FIG. 8 is a schematic diagram of a wafer inspection system using a CD, overlay, WIS, and/or TIS metrology system.

A potential important application of the CD, overlay, WIS, and TIS metrology systems described herein is the independent inspection of patterns in photoresist on wafers, masks, and reticles used in lithography methods wherein the patterns are generated by exposure induced changes with or without post exposure treatment in the refractive index, density and or thickness of the photoresist. As an example, a schematic of a wafer inspection system 900 using a CD, overlay, WIS, and/or TIS metrology system (not shown) is shown in FIG. 8. A source 910 generates a source beam 912 and a CD, overlay, WIS, or TIS metrology system 914 directs the radiation beam to a substrate 916 supported by a movable stage 918. To determine the relative position of the stage, an interferometry system 920 directs a reference beam 922 to a mirror 924 mounted on beam focusing assembly 914 and a measurement beam 926 to a mirror 928 mounted on stage 918. Changes in the position measured by the interferometry system correspond to changes in the relative position of write beam 912 on substrate 916. Interferometry system 920 sends a measurement signal 932 to controller 930 that is indicative of the relative position of inspection beam 912 on substrate 916. Controller 930 sends an output signal 934 to a base 936 that supports and positions stage 918. Controller 930 can cause the CD, overlay, WIS, or the TIS metrology system 914 to scan the inspection beam over a region of the substrate, e.g., using signal 944. As a result, controller 930 directs the other components of the system to inspect the substrate. The wafer inspection compares the wafer pattern directly with computer data used to generate the wafer pattern.

Other embodiments are within the following claims.

What is claimed is:

1. A method of processing a substrate on which a layer of photoresist has been applied, said method comprising:
   exposing the layer of photoresist to radiation that carries spatial information to generate exposure-induced changes in the layer of photoresist that form a pattern having one or more features;
   before developing the exposed photoresist, interferometrically obtaining measurements of the pattern in the exposed layer of photoresist; and
   using the interferometrically obtained measurements to determine at least one of (1) locations of the one or more features of the pattern and (2) magnitudes of the exposure-induced changes.

2. The method of claim 1, wherein interferometrically obtaining measurements involves:
   for each spot of an array of spots on the layer of photoresist,
   directing a measurement beam at that spot to produce a return measurement beam;
   interfering the return measurement beam with a reference beam to generate an interference beam; and
   detecting the interference beam to generate an electrical interference signal value.

3. The method of claim 1, wherein the pattern is produced by exposure-induced changes in a reflectivity of the photoresist.

4. The method of claim 1, wherein the pattern is produced by exposure-induced changes in an index of refraction of the photoresist.

5. The method of claim 1, wherein the pattern is produced by exposure-induced changes in a thickness of the photoresist.

6. The method of claim 1, wherein the pattern is produced by exposure-induced changes in a density of the photoresist.

7. The method of claim 1, wherein interferometrically obtaining measurements of the pattern in the layer of photoresist is performed concurrently with exposing the layer of photoresist to patterned radiation.

8. The method of claim 1, further comprising interferometrically obtaining other measurements of the pattern in the layer of photoresist for identifying defects on or in the layer of photoresist.

9. The method of claim 8, wherein using the interferometrically obtained measurements comprises using both the first-mentioned measurements and said other measurements to determine locations of the one or more features of the pattern.

10. The method of claim 9, wherein interferometrically obtaining the second said other measurements involves using a differential interferometric microscopy system.

11. The method of claim 10, wherein interferometrically obtaining the first-mentioned measurements involves using a linear displacement interferometric metrology system.

12. The method of claim 1, wherein using the interferometrically obtained measurements involves determining locations of the one or more features of the pattern relative to corresponding features of a second pattern in a layer under the layer of photoresist.

13. The method of claim 1, further comprising treating the layer of exposed photoresist prior to interferometrically obtaining measurements.

14. The method of claim 13, wherein treating involves a post exposure bake.

15. The method of claim 13, wherein treating involves silylating.

16. The method of claim 1, wherein interferometrically obtaining measurements of the pattern in the exposed layer of photoresist is done in situ with exposing.

17. The method of claim 1, wherein interferometrically obtaining measurements of the pattern involves interferometrically measuring properties of conjugated quadratures of optical fields generated by reflection/scattering or transmission/scattering of measurement beams by the pattern in exposed layer of photoresist.

18. The method of claim 17, wherein using the interferometrically obtained measurements involves analyzing relative phases of the measured conjugated quadratures to obtain relative locations of the one or more features.

19. The method of claim 17, wherein the properties of the conjugated quadratures of optical fields are far-field properties of those optical fields.

20. The method of claim 17, wherein the properties of the conjugated quadratures of optical fields are near-field properties of those optical fields.

21. The method of claim 17, wherein the properties of the conjugated quadratures of optical fields are evanescent-field properties of those optical fields.

22. The method of claim 1, wherein interferometrically measuring properties of conjugated quadratures of optical fields involves interferometrically measuring properties of amplitudes or phases of the conjugated quadratures of the optical fields.

23. The method of claim 1, wherein interferometrically obtaining measurements of the pattern in the exposed layer of photoresist for determining locations of the one or more features of the pattern involves using an interferometric confocal microscopy system.

24. The method of claim 1, wherein interferometrically obtaining measurements of the pattern in the exposed layer of photoresist for determining locations of the one or more features of the pattern involves using an interferometric non-confocal imaging system.

25. The method of claim 1, wherein interferometrically obtaining measurements of the pattern in the exposed layer of photoresist for determining locations of the one or more features of the pattern involves scanning with an interferometric metrology system.

26. The method of claim 1, wherein the interferometric metrology system is a displacement interferometric metrology system.

27. The method of claim 1, wherein interferometrically obtaining measurements of the pattern involves interferometrically measuring properties of conjugated quadratures of optical fields generated by backscattering of measurement beams by the pattern in exposed layer of photoresist.

28. The method of claim 1, wherein the locations are two-dimensional locations.

29. The method of claim 1, wherein the locations are three-dimensional locations.

30. The method of claim 1, wherein the spatial information is a projected two-dimensional patterned mask.

31. The method of claim 8, wherein interferometrically obtaining other measurements of the pattern in the layer of photoresist for identifying defects on or in the layer of photoresist is performed prior to interferometrically obtaining the first-mentioned measurements.

32. The method of claim 1, wherein using the interferometrically obtained measurements involves determining locations of the one or more features of the pattern relative to corresponding features of a second pattern formed in the layer of photoresist.

33. A method of processing a substrate on which a layer of photoresist has been applied, said method comprising:
    exposing the layer of photoresist to patterned radiation to generate exposure-induced changes in the layer of photoresist which form patterns having one or more features;
    before developing the exposed photoresist, interferometrically obtaining measurements of the pattern in the exposed layer of photoresist; and
    using the interferometrically obtained measurements to determine locations of the one or more features of the pattern.

* * * * *